(12) United States Patent
Tyagi

(10) Patent No.: US 10,833,162 B2
(45) Date of Patent: Nov. 10, 2020

(54) TRENCHED BOTTOM ELECTRODE AND LIFTOFF BASED MOLECULAR DEVICES

(71) Applicant: Pawan Tyagi, Derwood, MD (US)

(72) Inventor: Pawan Tyagi, Derwood, MD (US)

( * ) Notice: Subject to any disclaimer, the term of this patent is extended or adjusted under 35 U.S.C. 154(b) by 0 days.

(21) Appl. No.: 16/102,732

(22) Filed: Aug. 14, 2018

(65) Prior Publication Data

US 2020/0058752 A1 Feb. 20, 2020

(51) Int. Cl.
*H01L 29/43* (2006.01)
*H01L 21/02* (2006.01)
*H01L 21/027* (2006.01)
*H01L 21/04* (2006.01)

(52) U.S. Cl.
CPC .......... *H01L 29/43* (2013.01); *H01L 21/0226* (2013.01); *H01L 21/0274* (2013.01); *H01L 21/0425* (2013.01)

(58) Field of Classification Search
CPC .... B82Y 10/00; C12Q 1/003; G01N 33/5438; G01N 33/54353; G11C 13/0014; G11C 13/0019; H01L 29/40111; H01L 29/41; H01L 29/41766
See application file for complete search history.

(56) References Cited

U.S. PATENT DOCUMENTS

| 6,339,227 | B1 | 1/2002 | Ellenbogen |
| 6,778,853 | B1 | 8/2004 | Heller et al. |
| 6,824,974 | B2* | 11/2004 | Pisharody ............. C12Q 1/003 205/777.5 |
| 7,344,507 | B2* | 3/2008 | Briggs ............... A61B 5/14546 600/583 |

(Continued)

FOREIGN PATENT DOCUMENTS

WO 2004061416 7/2004

OTHER PUBLICATIONS

Pawan Tyagi, Spin Photovoltaic Effect on Molecule Coupled Ferromagnetic Films of a Magnetic Tunnel Junction, Nov. 2013, ASME, Proceedings of the ASME 2013 International Mechanical Engineering Congress and Exposition IMECE2013, all pages (Year: 2013).*

(Continued)

*Primary Examiner* — Victoria K. Hall
(74) *Attorney, Agent, or Firm* — Ariel S. Bentolila; Bay Area IP Group, LLC

(57) ABSTRACT

A system and method for fabricating at least one of, a molecular device element and a TBELMD including depositing a first electrode material on an insulating substrate or layer, performing a photolithography process in the first electrode material, creating a trench component in the first electrode material with the photolithography process, determining a section of the electrode material to remove based on at least one of, a molecular device element and a TBELMD to be produced, removing the section of said first electrode material, oxidizing a portion of the first electrode material, creating a first insulator part from the oxidized portion of the first electrode material, in which the oxidized portion of the first electrode material includes at least a first electrode metal surface, depositing a second electrode material, and bridging the first and second electrode material.

20 Claims, 16 Drawing Sheets

(56) References Cited

U.S. PATENT DOCUMENTS

| | | | | |
|---|---|---|---|---|
| 7,452,659 B2* | 11/2008 | McCarty | ............... | B82Y 10/00 430/311 |
| 8,697,562 B2* | 4/2014 | McCreery | ............. | B82Y 10/00 438/542 |
| 2004/0023253 A1* | 2/2004 | Kunwar | ................ | C12Q 1/003 435/6.11 |
| 2004/0048241 A1* | 3/2004 | Freeman | ............... | B82Y 10/00 435/5 |
| 2004/0102038 A1* | 5/2004 | Oglesby | ............... | B82Y 10/00 438/674 |
| 2004/0146863 A1* | 7/2004 | Pisharody | ............. | C12Q 1/003 435/6.11 |
| 2004/0248282 A1* | 12/2004 | Sobha | ................... | B82Y 10/00 435/287.2 |
| 2007/0200156 A1 | 8/2007 | Wunderlich et al. | | |
| 2008/0012047 A1 | 1/2008 | Bertin et al. | | |
| 2008/0017843 A1 | 1/2008 | Kaushal et al. | | |
| 2008/0205132 A1* | 8/2008 | Hirakata | ............... | B82Y 10/00 365/182 |
| 2013/0100724 A1* | 4/2013 | Venkataraman | ........ | G11B 5/02 365/145 |

OTHER PUBLICATIONS

A. Rocha et al., Towards molecular spintronics, Apr. 2005, Nature Materials, vol. 4, pp. 335-339. (Year: 2005).*

* cited by examiner

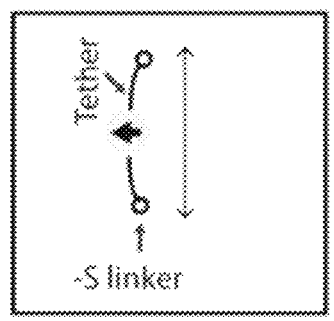
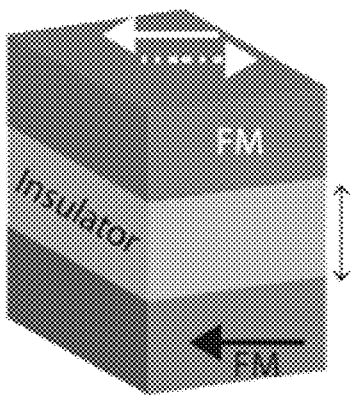
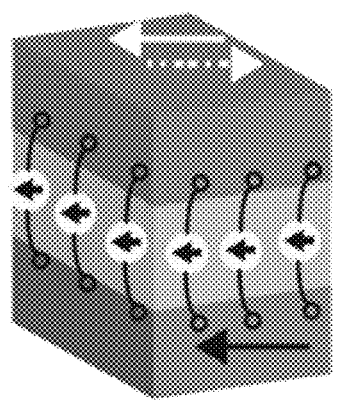
FIG. 1A
(PRIOR ART)
FIG. 1B
(PRIOR ART)
FIG. 1C
(PRIOR ART)
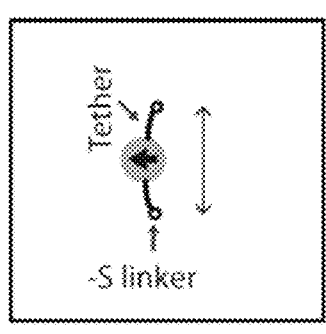
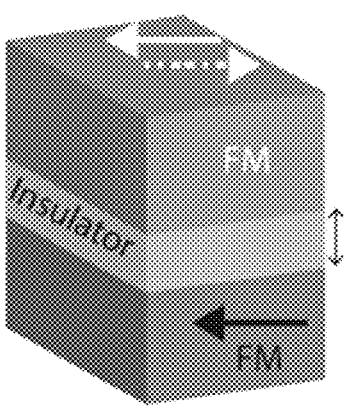
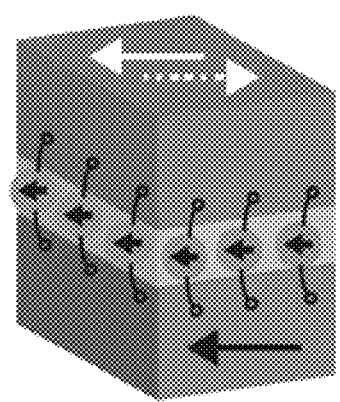
FIG. 1D
(PRIOR ART)
FIG. 1E
(PRIOR ART)
FIG. 1F
(PRIOR ART)

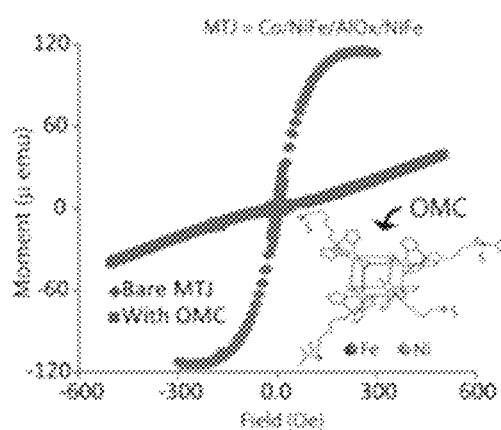
FIG. 2A
(PRIOR ART)
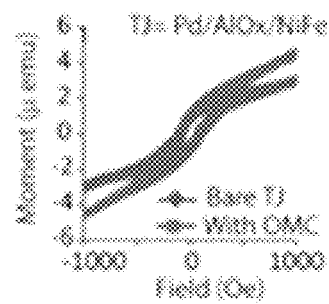
FIG. 2B
(PRIOR ART)
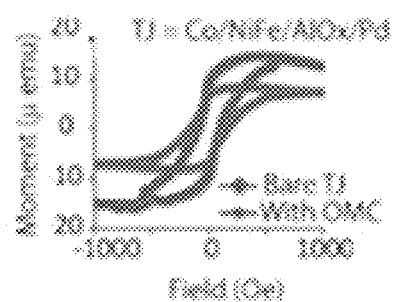
FIG. 2C
(PRIOR ART)
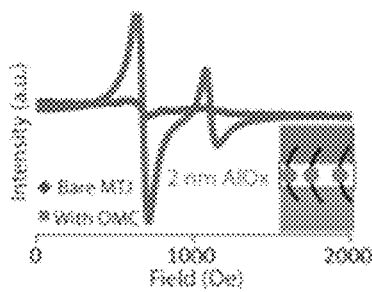
FIG. 2D
(PRIOR ART)
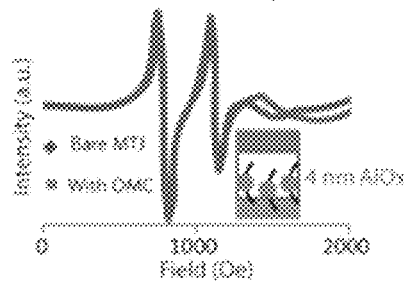
FIG. 2E
(PRIOR ART)
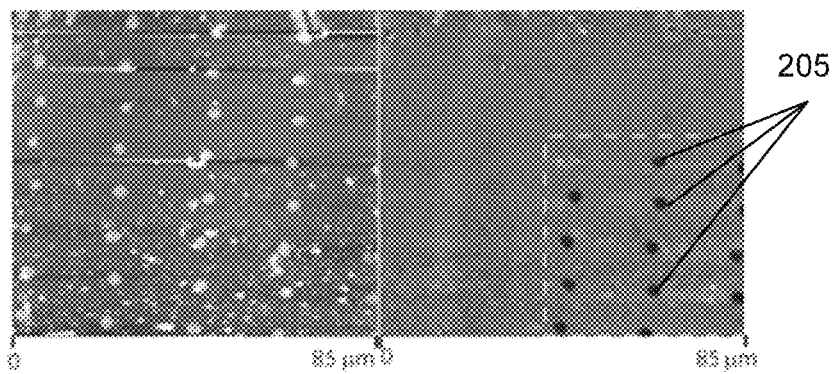
FIG. 2F
(PRIOR ART)
FIG. 2G
(PRIOR ART)

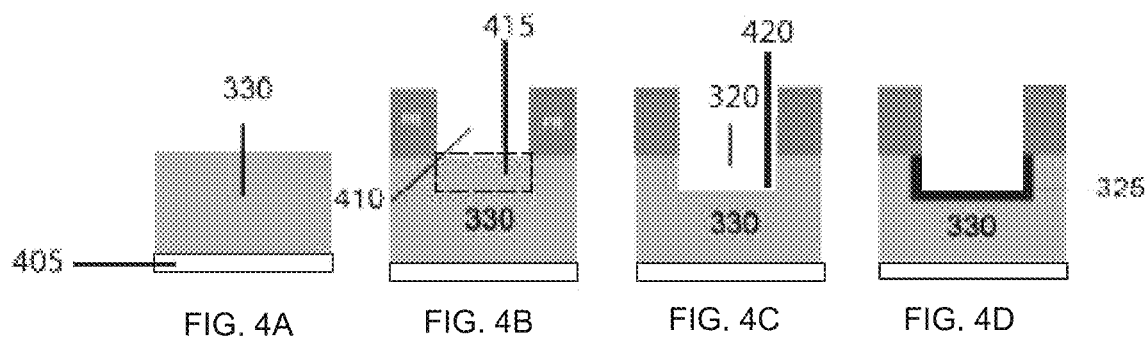
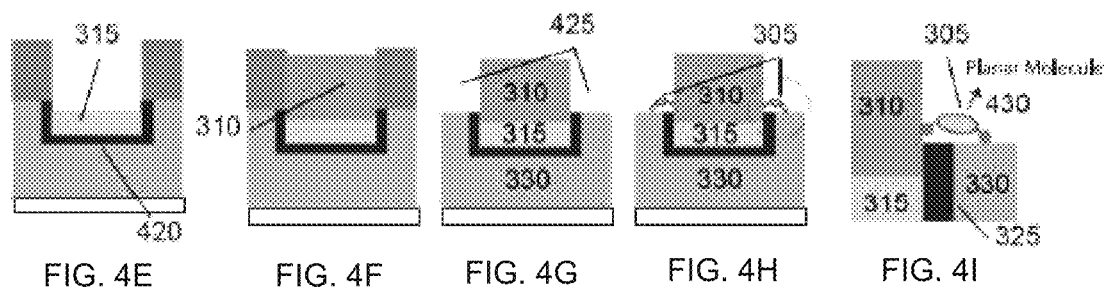
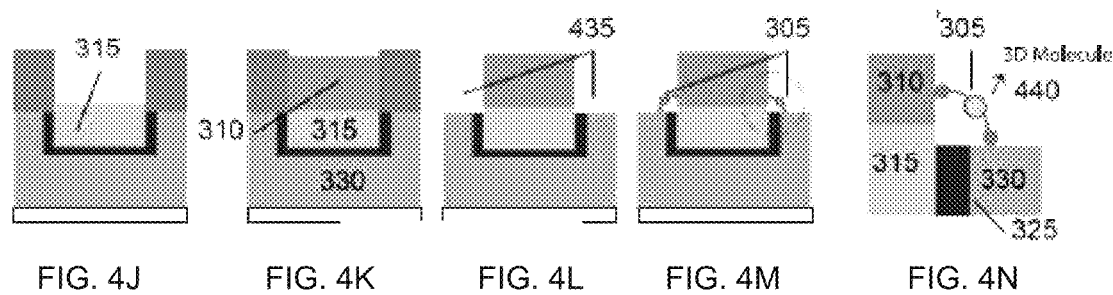

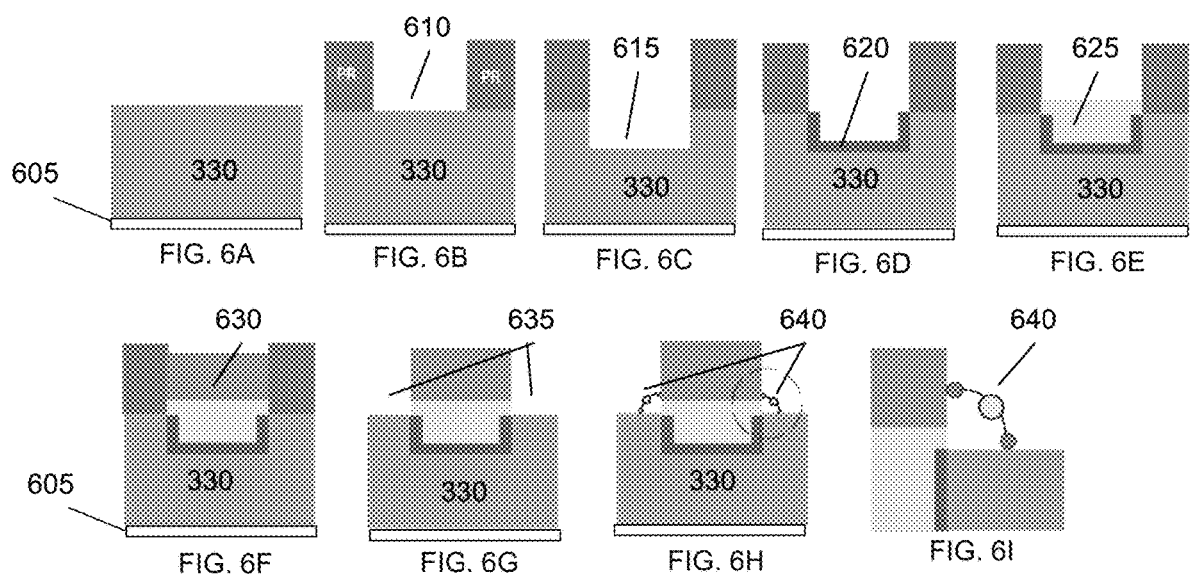

FIG. 8A Typical molecular structure for producing TBELMD
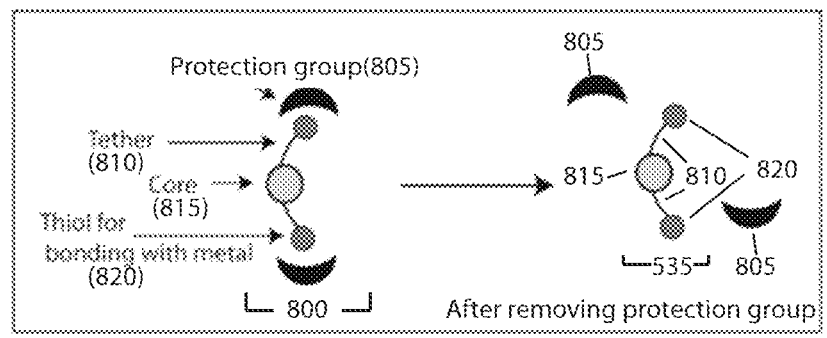
FIG. 8B Submerged in molecular solution
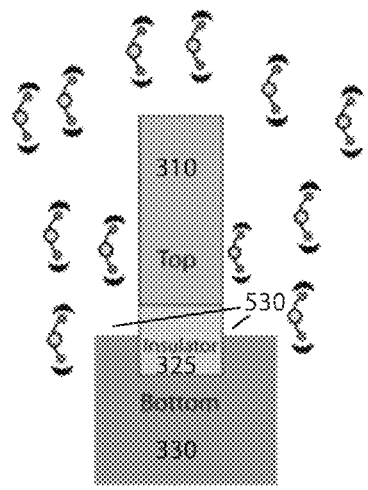
FIG. 8C Molecules are mobilized to reach exposed tunnel junction
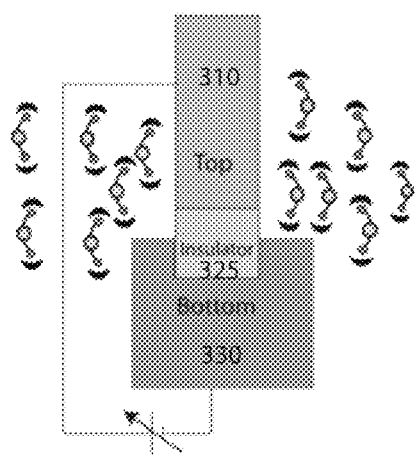
FIG. 8D Protection group removed
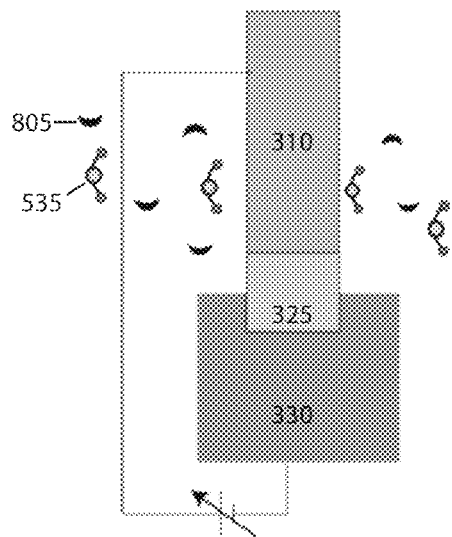
FIG. 8E Molecular bridges formed
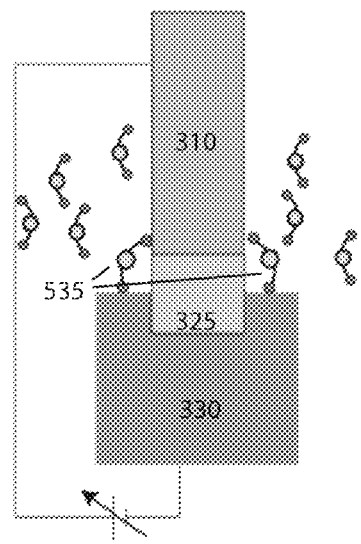

FIG. 10A  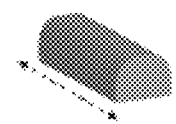
FIG. 10B 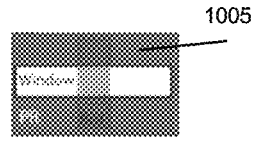 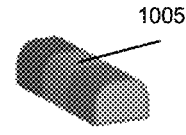
FIG. 10C 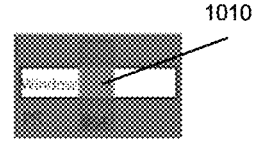 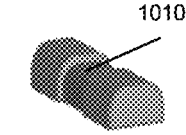
FIG. 10D 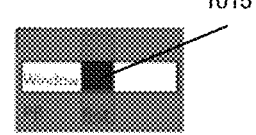 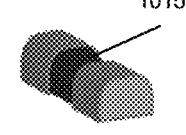
FIG. 10E 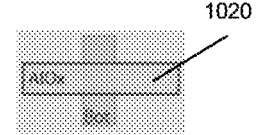 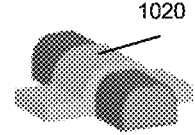
FIG. 10F 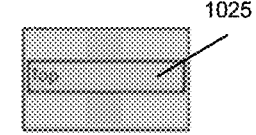 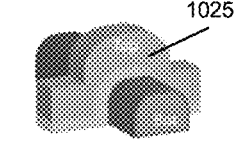
FIG. 10G 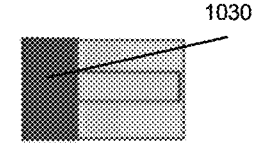 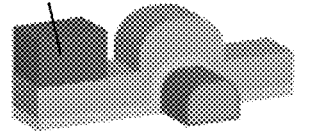
FIG. 10H 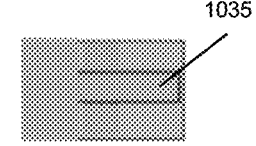 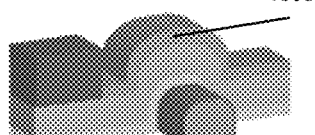
FIG. 10I 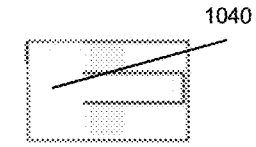 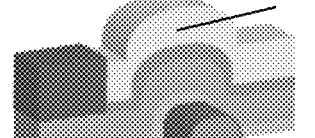
FIG. 10J 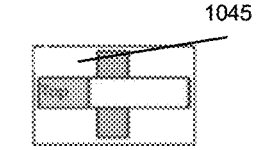 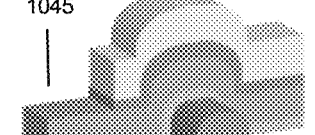

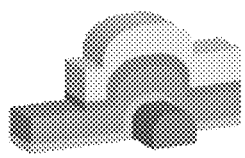
FIG. 11A
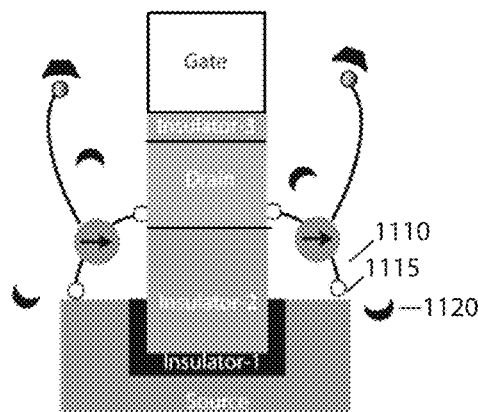
FIG. 11B
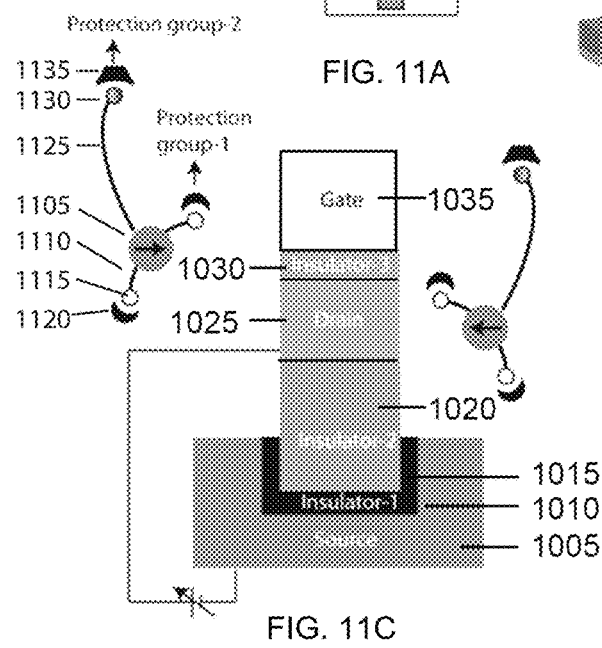
FIG. 11C
FIG. 11D
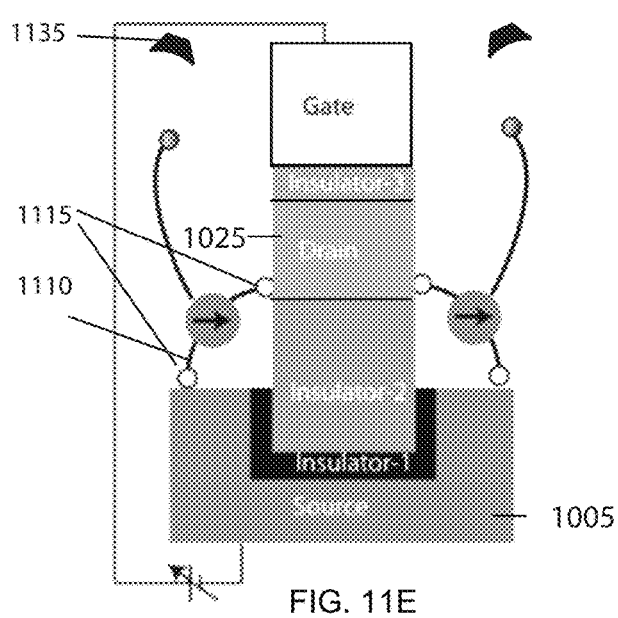
FIG. 11E
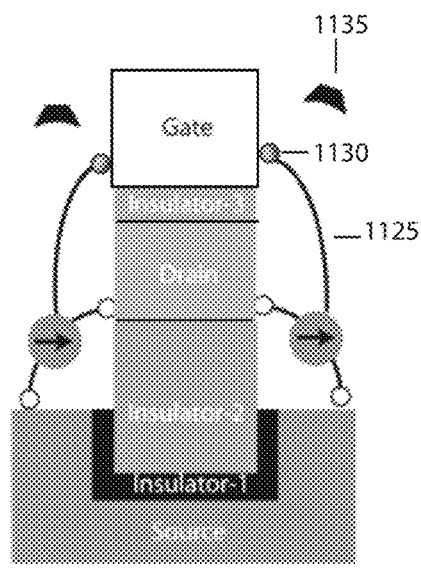
FIG. 11F

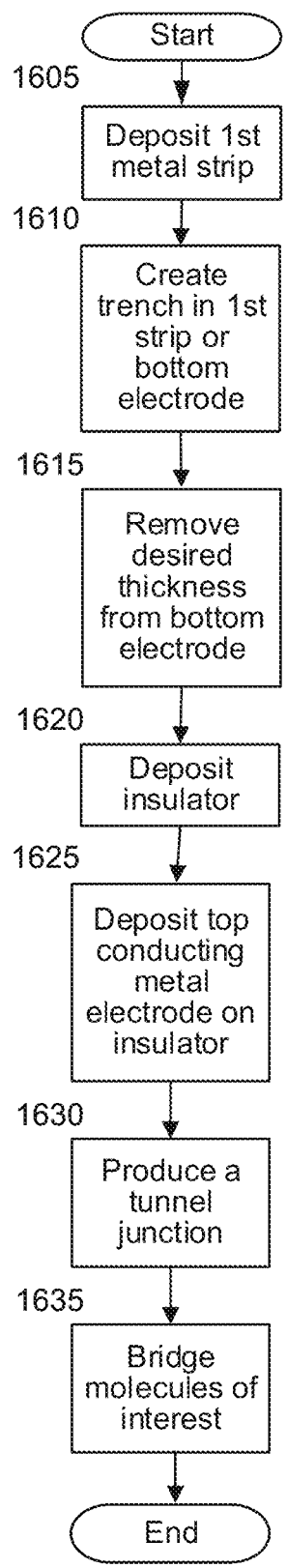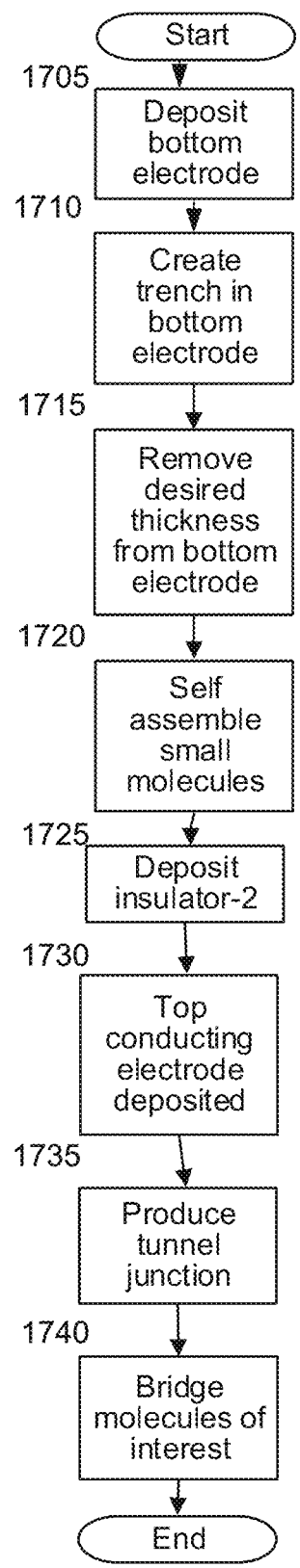
FIG. 16                     FIG. 17

TRENCHED BOTTOM ELECTRODE AND LIFTOFF BASED MOLECULAR DEVICES

CROSS-REFERENCE TO RELATED APPLICATIONS

Not applicable.

RELATED CO-PENDING U.S. PATENT APPLICATIONS

Not applicable.

INCORPORATION BY REFERENCE OF SEQUENCE LISTING PROVIDED AS A TEXT FILE

Not applicable.

FEDERALLY SPONSORED RESEARCH OR DEVELOPMENT

Not applicable.

REFERENCE TO SEQUENCE LISTING, A TABLE, OR A COMPUTER LISTING APPENDIX

Not applicable.

COPYRIGHT NOTICE

A portion of the disclosure of this patent document contains material that is subject to copyright protection by the author thereof. The copyright owner has no objection to the facsimile reproduction by anyone of the patent document or patent disclosure for the purposes of referencing as patent prior art, as it appears in the Patent and Trademark Office, patent file or records, but otherwise reserves all copyright rights whatsoever.

BACKGROUND OF THE RELEVANT PRIOR ART

One or more embodiments of the invention generally relate to fabrication of electronics or computer devices. More particularly, certain embodiments of the invention relate to fabrication of molecular electronics and molecular spintronics.

The following background information may present examples of specific aspects of the prior art (e.g., without limitation, approaches, facts, or common wisdom) that, while expected to be helpful to further educate the reader as to additional aspects of the prior art, is not to be construed as limiting the present invention, or any embodiments thereof, to anything stated or implied therein or inferred thereupon.

Electronics made with silicon based fabrication have seen steady improvements in miniaturization and performance throughout recent decades. Gordon Moore's "Moore's Law" famously predicted miniaturization and performance doubling every 18 months. As time went on it has become increasingly more difficult to keep up with this prediction. In 2015 Moore revised his law as dying in roughly the next decade. As the limits of silicon based integrated circuits (ICs) are closer, alternatives to silicon materials are being considered. One possible alternative to silicon ICs where research has shown promise is the utilization of molecular electronics and molecular spintronics.

The following is an example of a specific aspect in the prior art that, while expected to be helpful to further educate the reader as to additional aspects of the prior art, is not to be construed as limiting the present invention, or any embodiments thereof, to anything stated or implied therein or inferred thereupon. By way of educational background, an aspect of the prior art generally useful to be aware of is that while there may currently be some approaches to molecular electronics and molecular spintronics showing promise, there may generally be some concerns with fabrication of molecular electronics and molecular spintronics devices. Generally, those fabricating molecular devices may have difficulty mass producing molecular spintronics devices with conventional microfabrication tools like photolithography and sputtering machine based thin film deposition process. Generally, those fabricating molecular devices may have difficulty in conducting controlled experiments before and after completing fabrication. Generally, those fabricating molecular devices may have difficulty utilizing molecules whose typical thickness is smaller than the physical spacer between the two metal electrodes of a molecular device. Generally, those fabricating molecular spintronics may have difficulty using various configurations of ferromagnetic electrodes for making metal leads that will be connected to molecular device channels. In a prior patent, a method of making molecular devices was disclosed where the physical separation between the two conducting leads was equal to or less than the physical length of target molecule. Molecules are under the top conducting layer. In this patent, one cannot utilize small molecules that are smaller in physical length than the vertical insulating spacer between the two-conducting strip. Molecules are sandwiched between the two conducting electrodes and hence can not be accessed by a third metal strip that may perform as a Gate electrode to tune the molecular quantum states. The invention disclosed here is produced by addressing major challenges associated with magnetic tunnel junction based molecular devices discussed in the prior work by the inventor (Tyagi, P., 2011, "Multilayer edge molecular electronics devices: a review," J. Mater. Chem., 21(13), pp. 4733-4742).

FIG. 1 A to F illustrates prior art showing molecule focused views and side perspective views of a magnetic tunnel junction that may be transformed into molecular spintronics device typically by attaching molecular channels along the tunnel junction edge. The following is an example of a specific aspect in the prior art that, while expected to be helpful to further educate the reader as to additional aspects of the prior art, is not to be construed as limiting the present invention, or any embodiments thereof, to anything stated or implied therein or inferred thereupon. By way of educational background, an aspect of the prior art generally useful to be aware of is that all the prior work to date typically focuses on making insulator thickness less than the magnitude of molecule length. For the tunnel junction based molecular devices each molecule may usually have long tether to provide required length. To attach molecules to the metal leads or conductors tethers may typically have thiol (—S) like linker functional group. FIGS. 1A and 1B are conceptual sketches showing a method of transforming a magnetic tunnel junction into molecular spintronics device. Utilization of smaller length molecules required the reduction in tunnel barrier thickness to enable the successful bridging of molecular channels between two ferromagnetic metals. Two examples are discussed to clarify limitations of the past work. FIG. 1A illustrates a long target molecule where the length may usually be 3.5 nm. In FIG. 1B a tunnel junction may typically have <3.5 nm insulator thickness. FIG. 1C illustrates attaching the end of the molecular channels conventionally to the first and second ferromagnetic (FM) electrodes for a molecular spintronics device. However, thick insulator and long molecules typically may demand high operational electric power. High power requirement may usually lead to joule heating that may usually damage the molecular device channels. High heat may also typically lead to the classic heating issues with the current technology. Utilization of long molecule may conventionally also impact the spin coherence length and time. To avoid heating issues and to achieve high spin coherence short molecules may typically be used. Ability to utilize short to long molecules also may typically provide an ability to control the wave function overlap between molecule core and metal electrodes. However, utilization of short molecule typically necessitates a much thinner insulator that may usually be extremely difficult to produce over a large area and with a long operational life. For example, to integrate in FIG. 1D a short molecule of ~1.5 nm length, we may typically use a magnetic tunnel junction with ~1 nm insulator thickness in FIG. 1E. FIG. 1F illustrates a short molecules may usually bridge across the ~1 nm insulator to complete the transformation of a magnetic tunnel junction for a molecular spintronics device.

The challenge in using ~1 nm tunnel barrier may typically be extreme. It may conventionally be extremely challenging to produce atomically smooth and uniform thickness insulator by the industrially suitable sputtering process. Similarly, recent approaches like atomic layer deposition (ALD) may need to overcome complex technical challenges to deliver robust ultrathin insulator on various types of magnetic electrodes and metal electrodes. Thin tunnel barrier may usually be highly likely to have pin holes, or pathways for the hot electrons leading to high background current. High background current may typically mask the effect of molecules. Moreover, mechanical stresses that normally get generated during fabrication and utilization of a device may also typically easily damage a thin tunnel barrier.

To advance molecular spintronics area one may need to make actual devices with long interconnects to read and write signals. Ability to read and write signal from the molecular spintronics device may allow the development of significantly improved logic and memory devices that may work based on molecular quantum states.

In view of the foregoing, it is clear that these traditional techniques are not perfect and leave room for more optimal approaches.

BRIEF DESCRIPTION OF THE DRAWINGS

The present invention is illustrated by way of example, and not by way of limitation, in the figures of the accompanying drawings and in which like reference numerals refer to similar elements and in which:

FIGS. 1 A to F illustrate prior art showing molecule focused views and side perspective views of a magnetic tunnel junction that may be transformed into molecular spintronics device typically by attaching molecular channels along the tunnel junction edge;

FIGS. 2 A to G illustrate the inventor's prior approach showing graphs that may show proof of concept and scope of making magnetic tunnel junction based molecular devices, where FIGS. 2 A-C are in reference to a magnetometer, FIGS. 2 D-E are in reference to a ferromagnetic resonance, and FIGS. 2 F-G are in reference to a magnetic force microscopy;

FIGS. 4 A to N to, illustrate, by way of example, side cross-section views of the components of TBELMD formed at each ordered stage of an exemplary fabrication method for producing trenched bottom electrode based molecular devices, wherein FIGS. 4 A-D illustrate the initial stages in common, FIG. 4 illustrate subsequent stages done according to an exemplary alternative exemplary method "A", and FIGS. 4 J-N illustrate those stages done instead according to an exemplary alternative exemplary method "B", all in accordance with embodiments of the invention;

FIGS. 6 A-I illustrate, by way of example, side cross-section views of the components of TBELMD formed at each stage of an exemplary alternative exemplary method (referred to as method "D") for fabrication of trenched bottom electrode based molecular devices for the cases when bottom electrode cannot be oxidized to produce insulator-1, in accordance with an embodiment of the invention;

FIGS. 8 A-F illustrate side cross-section views of the before, during, and after states of exemplary molecules for the exemplary molecular device during the exemplary method of attaching molecules shown in FIG. 7 for the present molecular device, where FIG. 8 A illustrates molecules before and after deprotecting a thiol group, FIGS. 8 B and C illustrate electrophoretically concentrating molecules near a junction, and FIG. 8 D and FIG. 8 E illustrate removing protection group from thiol to facilitate metal-molecule chemical bonding, all in accordance with an embodiment of this invention;

FIG. 10 A to J illustrate, by way of example, various top and side perspective views of an exemplary three terminal TBELMD where a third metal electrode serves as a Gate, at each stage of an exemplary process flow for creating, in accordance with an embodiment of the invention;

FIGS. 11 A-F illustrate top, side perspective and cross sectional views of a required exemplary form of the molecule and the method of bonding the same molecule to the three metal strips to form the field effect based molecular devices, where the top view FIG. 11 A shows chemically bonding of the molecules with the metal strips that may require the submerging of the junction into a molecular solution, side perspective view FIG. 11 B shows the 3D side view of the junction, and cross sectional view FIG. 11 C shows electrophoretically concentrated molecules near a junction, FIG. 11 D shows selective removal of protection group-1 to connect a molecule to source and drain metals, FIG. 11 E shows selective removal of protection group-2 by applying a bias on Gate electrode, FIG. 11 F shows a long tether getting attached to a Gate electrode, all in accordance with an embodiment of the invention;

FIGS. 12 A and B illustrate cross sectional views of an exemplary three terminal molecular device serving as a logic device, where

FIG. 16 illustrates a flow chart of a method for forming exemplary components of TBELMD (referred to as method "C") for fabrication of a trenched bottom electrode based molecular devices for the cases when bottom electrode cannot be oxidized to produce insulator-1, in accordance with an embodiment of the invention;

FIG. 17 illustrates a flow chart of a method for forming semiconductor structures (referred to as method "0") for fabrication of trenched bottom electrode based molecular devices for the cases when bottom electrode cannot be oxidized to produce insulator-1, in accordance with an embodiment of the invention; and.

Figure 3A:
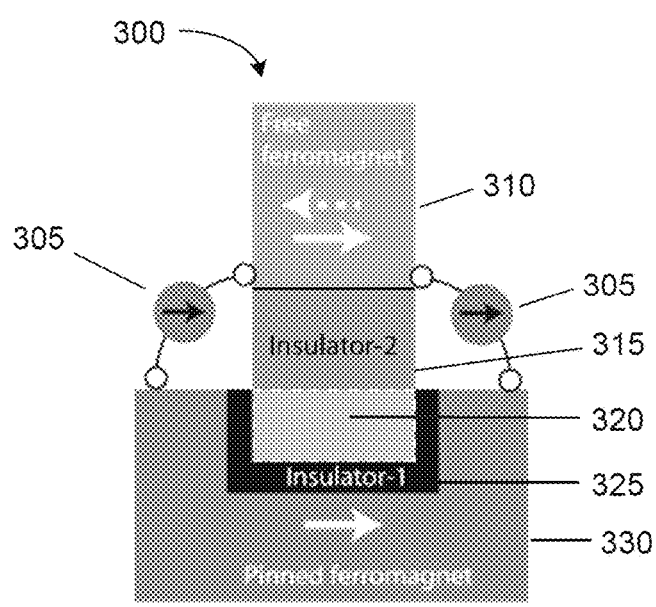
FIGS. 3A and 3B, illustrate cross-sectional views, respectively, of exemplary Trenched Bottom Electrode and Liftoff based Molecular Devices (TBELMDs), wherein 3A illustrates a device with two terminals and 3B illustrates a device with three terminals, in accordance with an embodiment of the present invention.

Unless otherwise indicated illustrations in the figures are not necessarily drawn to scale.

DETAILED DESCRIPTION OF SOME EMBODIMENTS

The present invention is best understood by reference to the detailed figures and description set forth herein.

Embodiments of the invention are discussed below with reference to the Figures. However, those skilled in the art will readily appreciate that the detailed description given herein with respect to these figures is for explanatory purposes as the invention extends beyond these limited embodiments. For example, it should be appreciated that those skilled in the art will, in light of the teachings of the present invention, recognize a multiplicity of alternate and suitable approaches, depending upon the needs of the particular application, to implement the functionality of any given detail described herein, beyond the particular implementation choices in the following embodiments described and shown. That is, there are modifications and variations of the invention that are too numerous to be listed but that all fit within the scope of the invention. Also, singular words should be read as plural and vice versa and masculine as feminine and vice versa, where appropriate, and alternative embodiments do not necessarily imply that the two are mutually exclusive.

It is to be further understood that the present invention is not limited to the particular methodology, compounds, materials, manufacturing techniques, uses, and applications, described herein, as these may vary. It is also to be understood that the terminology used herein is used for the purpose of describing particular embodiments only, and is not intended to limit the scope of the present invention. It must be noted that as used herein and in the appended claims, the singular forms "a," "an," and "the" include the plural reference unless the context clearly dictates otherwise. Thus, for example, a reference to "an element" is a reference to one or more elements and includes equivalents thereof known to those skilled in the art. Similarly, for another example, a reference to "a step" or "a means" is a reference to one or more steps or means and may include sub-steps and subservient means. All conjunctions used are to be understood in the most inclusive sense possible. Thus, the word "or" should be understood as having the definition of a logical "or" rather than that of a logical "exclusive or" unless the context clearly necessitates otherwise. Structures described herein are to be understood also to refer to functional equivalents of such structures. Language that may be construed to express approximation should be so understood unless the context clearly dictates otherwise.

All words of approximation as used in the present disclosure and claims should be construed to mean "approximate," rather than "perfect," and may accordingly be employed as a meaningful modifier to any other word, specified parameter, quantity, quality, or concept. Words of approximation, include, yet are not limited to terms such as "substantial", "nearly", "almost", "about", "generally", "largely", "essentially", "closely approximate", etc.

As will be established in some detail below, it is well settled law, as early as 1939, that words of approximation are not indefinite in the claims even when such limits are not defined or specified in the specification.

For example, see Ex parte Mallory, 52 USPQ 297, 297 (Pat. Off. Bd. App. 1941) where the court said "The examiner has held that most of the claims are inaccurate because apparently the laminar film will not be entirely eliminated. The claims specify that the film is "substantially" eliminated and for the intended purpose, it is believed that the slight portion of the film which may remain is negligible. We are of the view, therefore, that the claims may be regarded as sufficiently accurate."

Note that claims need only "reasonably apprise those skilled in the art" as to their scope to satisfy the definiteness requirement. See Energy Absorption Sys., Inc. v. Roadway Safety Servs., Inc., Civ. App. 96-1264, slip op. at 10 (Fed. Cir. Jul. 3, 1997) (unpublished) Hybridtech v. Monoclonal Antibodies, Inc., 802 F.2d 1367, 1385, 231 USPQ 81, 94 (Fed. Cir. 1986), cert. denied, 480 U.S. 947 (1987). In addition, the use of modifiers in the claim, like "generally" and "substantial," does not by itself render the claims indefinite. See Seattle Box Co. v. Industrial Crating & Packing, Inc., 731 F.2d 818, 828-29, 221 USPQ 568, 575-76 (Fed. Cir. 1984).

Moreover, the ordinary and customary meaning of terms like "substantially" includes "reasonably close to: nearly, almost, about", connoting a term of approximation. See In re Frye, Appeal No. 2009-006013, 94 USPQ2d 1072, 1077, 2010 WL 889747 (B.P.A.I. 2010) Depending on its usage, the word "substantially" can denote either language of approximation or language of magnitude. Deering Precision Instruments, L.L.C. v. Vector Distribution Sys., Inc., 347 F.3d 1314, 1323 (Fed. Cir. 2003) (recognizing the "dual ordinary meaning of th[e] term ["substantially"] as connoting a term of approximation or a term of magnitude"). Here, when referring to the "substantially halfway" limitation, the Specification uses the word "approximately" as a substitute for the word "substantially" (Fact 4). The ordinary meaning of "substantially halfway" is thus reasonably close to or nearly at the midpoint between the forwardmost point of the upper or outsole and the rearwardmost point of the upper or outsole.

Similarly, the term 'substantially' is well recognized in case law to have the dual ordinary meaning of connoting a term of approximation or a term of magnitude. See Dana Corp. v. American Axle & Manufacturing, Inc., Civ. App. 04-1116, 2004 U.S. App. LEXIS 18265, *13-14 (Fed. Cir. Aug. 27, 2004) (unpublished). The term "substantially" is commonly used by claim drafters to indicate approximation. See Cordis Corp. v. Medtronic AVE Inc., 339 F.3d 1352, 1360 (Fed. Cir. 2003) ("The patents do not set out any numerical standard by which to determine whether the thickness of the wall surface is 'substantially uniform.' The term 'substantially,' as used in this context, denotes approximation. Thus, the walls must be of largely or approximately uniform thickness."); see also Deering Precision Instruments, LLC v. Vector Distribution Sys., Inc., 347 F.3d 1314, 1322 (Fed. Cir. 2003); Epcon Gas Sys., Inc. v. Bauer Compressors, Inc., 279 F.3d 1022, 1031 (Fed. Cir. 2002). We find that the term "substantially" was used in just such a manner in the claims of the patents-in-suit: "substantially uniform wall thickness" denotes a wall thickness with approximate uniformity.

It should also be noted that such words of approximation as contemplated in the foregoing clearly limits the scope of claims such as saying 'generally parallel' such that the adverb 'generally' does not broaden the meaning of parallel. Accordingly, it is well settled that such words of approximation as contemplated in the foregoing (e.g., like the phrase 'generally parallel') envisions some amount of deviation from perfection (e.g., not exactly parallel), and that such words of approximation as contemplated in the foregoing are descriptive terms commonly used in patent claims to avoid a strict numerical boundary to the specified parameter. To the extent that the plain language of the claims relying on such words of approximation as contemplated in the foregoing are clear and uncontradicted by anything in the written description herein or the figures thereof, it is improper to rely upon the present written description, the figures, or the prosecution history to add limitations to any of the claim of the present invention with respect to such words of approximation as contemplated in the foregoing. That is, under such circumstances, relying on the written description and prosecution history to reject the ordinary and customary meanings of the words themselves is impermissible. See, for example, Liquid Dynamics Corp. v. Vaughan Co., 355 F.3d 1361, 69 USPQ2d 1595, 1600-01 (Fed. Cir. 2004). The plain language of phrase 2 requires a "substantial helical flow." The term "substantial" is a meaningful modifier implying "approximate," rather than "perfect." In Cordis Corp. v. Medtronic AVE, Inc., 339 F.3d 1352, 1361 (Fed. Cir. 2003), the district court imposed a precise numeric constraint on the term "substantially uniform thickness." We noted that the proper interpretation of this term was "of largely or approximately uniform thickness" unless something in the prosecution history imposed the "clear and unmistakable disclaimer" needed for narrowing beyond this simple-language interpretation.

The reader should appreciate that case law generally recognizes a dual ordinary meaning of such words of approximation, as contemplated in the foregoing, as connoting a term of approximation or a term of magnitude; e.g., see Deering Precision Instruments, L.L.C. v. Vector Distrib. Sys., Inc., 347 F.3d 1314, 68 USPQ2d 1716, 1721 (Fed. Cir. 2003), cert. denied, 124 S. Ct. 1426 (2004) where the court was asked to construe the meaning of the term "substantially" in a patent claim. Also see Epcon, 279 F.3d at 1031 ("The phrase 'substantially constant' denotes language of approximation, while the phrase 'substantially below' signifies language of magnitude, i.e., not insubstantial."). Also, see, e.g., Epcon Gas Sys., Inc. v. Bauer Compressors, Inc., 279 F.3d 1022 (Fed. Cir. 2002) (construing the terms "substantially constant" and "substantially below"); Zodiac Pool Care, Inc. v. Hoffinger Indus., Inc., 206 F.3d 1408 (Fed. Cir. 2000) (construing the term "substantially inward"); York Prods., Inc. v. Cent. Tractor Farm & Family Ctr., 99 F.3d 1568 (Fed. Cir. 1996) (construing the term "substantially the entire height thereof"); Tex. Instruments Inc. v. Cypress Semiconductor Corp., 90 F.3d 1558 (Fed. Cir. 1996) (construing the term "substantially in the common plane"). In conducting their analysis, the court instructed to begin with the ordinary meaning of the claim terms to one of ordinary skill in the art. Prima Tek, 318 F.3d at 1148. Reference to dictionaries and our cases indicates that the term "substantially" has numerous ordinary meanings. As the district court stated, "substantially" can mean "significantly" or "considerably." The term "substantially" can also mean "largely" or "essentially." Webster's New 20th Century Dictionary 1817 (1983).

Words of approximation, as contemplated in the foregoing, may also be used in phrases establishing approximate ranges or limits, where the end points are inclusive and approximate, not perfect; e.g., see AK Steel Corp. v. Sollac, 344 F.3d 1234, 68 USPQ2d 1280, 1285 (Fed. Cir. 2003) where the court said "[W]e conclude that the ordinary meaning of the phrase "up to about 10%" includes the "about 10%" endpoint." As pointed out by AK Steel, when an object of the preposition "up to" is nonnumeric, the most natural meaning is to exclude the object (e.g., painting the wall up to the door). On the other hand, as pointed out by Sollac, when the object is a numerical limit, the normal meaning is to include that upper numerical limit (e.g., counting up to ten, seating capacity for up to seven passengers). Because we have here a numerical limit—"about 10%" the ordinary meaning is that that endpoint is included.

In the present specification and claims, a goal of employment of such words of approximation, as contemplated in the foregoing, is to avoid a strict numerical boundary to the modified specified parameter, as sanctioned by Pall Corp. v. Micron Separations, Inc., 66 F.3d 1211, 1217, 36 USPQ2d 1225, 1229 (Fed. Cir. 1995) where it states "It is well established that when the term "substantially" serves reasonably to describe the subject matter so that its scope would be understood by persons in the field of the invention, and to distinguish the claimed subject matter from the prior art, it is not indefinite." Likewise see Verve LLC v. Crane Cams Inc., 311 F.3d 1116, 65 USPQ2d 1051, 1054 (Fed. Cir. 2002). Expressions such as "substantially" are used in patent documents when warranted by the nature of the invention, in order to accommodate the minor variations that may be appropriate to secure the invention. Such usage may well satisfy the charge to "particularly point out and distinctly claim" the invention, 35 U.S.C. § 112, and indeed may be necessary in order to provide the inventor with the benefit of his invention. In Andrew Corp. v. Gabriel Elecs. Inc., 847

F.2d 819, 821-22, 6 USPQ2d 2010, 2013 (Fed. Cir. 1988) the court explained that usages such as "substantially equal" and "closely approximate" may serve to describe the invention with precision appropriate to the technology and without intruding on the prior art. The court again explained in Ecolab Inc. v. Envirochem, Inc., 264 F.3d 1358, 1367, 60 USPQ2d 1173, 1179 (Fed. Cir. 2001) that "like the term 'about,' the term 'substantially' is a descriptive term commonly used in patent claims to 'avoid a strict numerical boundary to the specified parameter, see Ecolab Inc. v. Envirochem Inc., 264 F.3d 1358, 60 USPQ2d 1173, 1179 (Fed. Cir. 2001) where the court found that the use of the term "substantially" to modify the term "uniform" does not render this phrase so unclear such that there is no means by which to ascertain the claim scope.

Similarly, other courts have noted that like the term "about," the term "substantially" is a descriptive term commonly used in patent claims to "avoid a strict numerical boundary to the specified parameter."; e.g., see Pall Corp. v. Micron Seps., 66 F.3d 1211, 1217, 36 USPQ2d 1225, 1229 (Fed. Cir. 1995); see, e.g., Andrew Corp. v. Gabriel Elecs. Inc., 847 F.2d 819, 821-22, 6 USPQ2d 2010, 2013 (Fed. Cir. 1988) (noting that terms such as "approach each other," "close to," "substantially equal," and "closely approximate" are ubiquitously used in patent claims and that such usages, when serving reasonably to describe the claimed subject matter to those of skill in the field of the invention, and to distinguish the claimed subject matter from the prior art, have been accepted in patent examination and upheld by the courts). In this case, "substantially" avoids the strict 100% nonuniformity boundary.

Indeed, the foregoing sanctioning of such words of approximation, as contemplated in the foregoing, has been established as early as 1939, see Ex parte Mallory, 52 USPQ 297, 297 (Pat. Off. Bd. App. 1941) where, for example, the court said "the claims specify that the film is "substantially" eliminated and for the intended purpose, it is believed that the slight portion of the film which may remain is negligible. We are of the view, therefore, that the claims may be regarded as sufficiently accurate." Similarly, In re Hutchison, 104 F.2d 829, 42 USPQ 90, 93 (C.C.P.A. 1939) the court said "It is realized that "substantial distance" is a relative and somewhat indefinite term, or phrase, but terms and phrases of this character are not uncommon in patents in cases where, according to the art involved, the meaning can be determined with reasonable clearness."

Hence, for at least the forgoing reason, Applicants submit that it is improper for any examiner to hold as indefinite any claims of the present patent that employ any words of approximation.

Unless defined otherwise, all technical and scientific terms used herein have the same meanings as commonly understood by one of ordinary skill in the art to which this invention belongs. Preferred methods, techniques, devices, and materials are described, although any methods, techniques, devices, or materials similar or equivalent to those described herein may be used in the practice or testing of the present invention. Structures described herein are to be understood also to refer to functional equivalents of such structures. The present invention will be described in detail below with reference to embodiments thereof as illustrated in the accompanying drawings.

References to a "device," an "apparatus," a "system," etc., in the preamble of a claim should be construed broadly to mean "any structure meeting the claim terms" except for any specific structure(s)/type(s) that has/(have) been explicitly disavowed or excluded or admitted/implied as prior art in the present specification or incapable of enabling an object/aspect/goal of the invention. Furthermore, where the present specification discloses an object, aspect, function, goal, result, or advantage of the invention that a specific prior art structure and/or method step is similarly capable of performing yet in a very different way, the present invention disclosure is intended to and shall also implicitly include and cover additional corresponding alternative embodiments that are otherwise identical to that explicitly disclosed except that they exclude such prior art structure(s)/step(s), and shall accordingly be deemed as providing sufficient disclosure to support a corresponding negative limitation in a claim claiming such alternative embodiment(s), which exclude such very different prior art structure(s)/step(s) way(s).

From reading the present disclosure, other variations and modifications will be apparent to persons skilled in the art. Such variations and modifications may involve equivalent and other features which are already known in the art, and which may be used instead of or in addition to features already described herein.

Although Claims have been formulated in this Application to particular combinations of features, it should be understood that the scope of the disclosure of the present invention also includes any novel feature or any novel combination of features disclosed herein either explicitly or implicitly or any generalization thereof, whether or not it relates to the same invention as presently claimed in any Claim and whether or not it mitigates any or all of the same technical problems as does the present invention.

Features which are described in the context of separate embodiments may also be provided in combination in a single embodiment. Conversely, various features which are, for brevity, described in the context of a single embodiment, may also be provided separately or in any suitable subcombination. The Applicants hereby give notice that new Claims may be formulated to such features and/or combinations of such features during the prosecution of the present Application or of any further Application derived therefrom.

References to "one embodiment," "an embodiment," "example embodiment," "various embodiments," "some embodiments," "embodiments of the invention," etc., may indicate that the embodiment(s) of the invention so described may include a particular feature, structure, or characteristic, but not every possible embodiment of the invention necessarily includes the particular feature, structure, or characteristic. Further, repeated use of the phrase "in one embodiment," or "in an exemplary embodiment," "an embodiment," do not necessarily refer to the same embodiment, although they may. Moreover, any use of phrases like "embodiments" in connection with "the invention" are never meant to characterize that all embodiments of the invention must include the particular feature, structure, or characteristic, and should instead be understood to mean "at least some embodiments of the invention" include the stated particular feature, structure, or characteristic.

References to "user", or any similar term, as used herein, may mean a human or non-human user thereof. Moreover, "user", or any similar term, as used herein, unless expressly stipulated otherwise, is contemplated to mean users at any stage of the usage process, to include, without limitation, direct user(s), intermediate user(s), indirect user(s), and end user(s). The meaning of "user", or any similar term, as used herein, should not be otherwise inferred or induced by any pattern(s) of description, embodiments, examples, or referenced prior-art that may (or may not) be provided in the present patent.

References to "end user", or any similar term, as used herein, is generally intended to mean late stage user(s) as opposed to early stage user(s). Hence, it is contemplated that there may be a multiplicity of different types of "end user" near the end stage of the usage process. Where applicable, especially with respect to distribution channels of embodiments of the invention comprising consumed retail products/services thereof (as opposed to sellers/vendors or Original Equipment Manufacturers), examples of an "end user" may include, without limitation, a "consumer", "buyer", "customer", "purchaser", "shopper", "enjoyer", "viewer", or individual person or non-human thing benefiting in any way, directly or indirectly, from use of or interaction, with some aspect of the present invention.

In some situations, some embodiments of the present invention may provide beneficial usage to more than one stage or type of usage in the foregoing usage process. In such cases where multiple embodiments targeting various stages of the usage process are described, references to "end user", or any similar term, as used therein, are generally intended to not include the user that is the furthest removed, in the foregoing usage process, from the final user therein of an embodiment of the present invention.

Where applicable, especially with respect to retail distribution channels of embodiments of the invention, intermediate user(s) may include, without limitation, any individual person or non-human thing benefiting in any way, directly or indirectly, from use of, or interaction with, some aspect of the present invention with respect to selling, vending, Original Equipment Manufacturing, marketing, merchandising, distributing, service providing, and the like thereof.

References to "person", "individual", "human", "a party", "animal", "creature", or any similar term, as used herein, even if the context or particular embodiment implies living user, maker, or participant, it should be understood that such characterizations are sole by way of example, and not limitation, in that it is contemplated that any such usage, making, or participation by a living entity in connection with making, using, and/or participating, in any way, with embodiments of the present invention may be substituted by such similar performed by a suitably configured non-living entity, to include, without limitation, automated machines, robots, humanoids, computational systems, information processing systems, artificially intelligent systems, and the like. It is further contemplated that those skilled in the art will readily recognize the practical situations where such living makers, users, and/or participants with embodiments of the present invention may be in whole, or in part, replaced with such non-living makers, users, and/or participants with embodiments of the present invention. Likewise, when those skilled in the art identify such practical situations where such living makers, users, and/or participants with embodiments of the present invention may be in whole, or in part, replaced with such non-living makers, it will be readily apparent in light of the teachings of the present invention how to adapt the described embodiments to be suitable for such non-living makers, users, and/or participants with embodiments of the present invention. Thus, the invention is thus to also cover all such modifications, equivalents, and alternatives falling within the spirit and scope of such adaptations and modifications, at least in part, for such non-living entities.

Headings provided herein are for convenience and are not to be taken as limiting the disclosure in any way.

The enumerated listing of items does not imply that any or all of the items are mutually exclusive, unless expressly specified otherwise.

It is understood that the use of specific component, device and/or parameter names are for example only and not meant to imply any limitations on the invention. The invention may thus be implemented with different nomenclature/terminology utilized to describe the mechanisms/units/structures/components/devices/parameters herein, without limitation. Each term utilized herein is to be given its broadest interpretation given the context in which that term is utilized.

Terminology. The following paragraphs provide definitions and/or context for terms found in this disclosure (including the appended claims):

"Comprising." This term is open-ended. As used in the appended claims, this term does not foreclose additional structure or steps. Consider a claim that recites: "A memory controller comprising a system cache . . . ." Such a claim does not foreclose the memory controller from including additional components (e.g., a memory channel unit, a switch).

"Configured To." Various units, circuits, or other components may be described or claimed as "configured to" perform a task or tasks. In such contexts, "configured to" or "operable for" is used to connote structure by indicating that the mechanisms/units/circuits/components include structure (e.g., circuitry and/or mechanisms) that performs the task or tasks during operation. As such, the mechanisms/unit/circuit/component can be said to be configured to (or be operable) for perform(ing) the task even when the specified mechanisms/unit/circuit/component is not currently operational (e.g., is not on). The mechanisms/units/circuits/components used with the "configured to" or "operable for" language include hardware—for example, mechanisms, structures, electronics, circuits, memory storing program instructions executable to implement the operation, etc. Reciting that a mechanism/unit/circuit/component is "configured to" or "operable for" perform(ing) one or more tasks is expressly intended not to invoke 35 U.S.C. .sctn.112, sixth paragraph, for that mechanism/unit/circuit/component. "Configured to" may also include adapting a manufacturing process to fabricate devices or components that are adapted to implement or perform one or more tasks.

"Based On." As used herein, this term is used to describe one or more factors that affect a determination. This term does not foreclose additional factors that may affect a determination. That is, a determination may be solely based on those factors or based, at least in part, on those factors. Consider the phrase "determine A based on B." While B may be a factor that affects the determination of A, such a phrase does not foreclose the determination of A from also being based on C. In other instances, A may be determined based solely on B.

The terms "a", "an" and "the" mean "one or more", unless expressly specified otherwise.

Unless otherwise indicated, all numbers expressing conditions, concentrations, dimensions, and so forth used in the specification and claims are to be understood as being modified in all instances by the term "about." Accordingly, unless indicated to the contrary, the numerical parameters set forth in the following specification and attached claims are approximations that may vary depending at least upon a specific analytical technique.

The term "comprising," which is synonymous with "including," "containing," or "characterized by" is inclusive or open-ended and does not exclude additional, unrecited elements or method steps. "Comprising" is a term of art used in claim language which means that the named claim elements are essential, but other claim elements may be added and still form a construct within the scope of the claim.

As used herein, the phase "consisting of" excludes any element, step, or ingredient not specified in the claim. When the phrase "consists of" (or variations thereof) appears in a clause of the body of a claim, rather than immediately following the preamble, it limits only the element set forth in that clause; other elements are not excluded from the claim as a whole. As used herein, the phase "consisting essentially of" and "consisting of" limits the scope of a claim to the specified elements or method steps, plus those that do not materially affect the basis and novel characteristic(s) of the claimed subject matter (see Norian Corp. v Stryker Corp., 363 F.3d 1321, 1331-32, 70 USPQ2d 1508, Fed. Cir. 2004). Moreover, for any claim of the present invention which claims an embodiment "consisting essentially of" or "consisting of" a certain set of elements of any herein described embodiment it shall be understood as obvious by those skilled in the art that the present invention also covers all possible varying scope variants of any described embodiment(s) that are each exclusively (i.e., "consisting essentially of") functional subsets or functional combination thereof such that each of these plurality of exclusive varying scope variants each consists essentially of any functional subset(s) and/or functional combination(s) of any set of elements of any described embodiment(s) to the exclusion of any others not set forth therein. That is, it is contemplated that it will be obvious to those skilled how to create a multiplicity of alternate embodiments of the present invention that simply consisting essentially of a certain functional combination of elements of any described embodiment(s) to the exclusion of any others not set forth therein, and the invention thus covers all such exclusive embodiments as if they were each described herein.

With respect to the terms "comprising," "consisting of," and "consisting essentially of," where one of these three terms is used herein, the disclosed and claimed subject matter may include the use of either of the other two terms. Thus in some embodiments not otherwise explicitly recited, any instance of "comprising" may be replaced by "consisting of" or, alternatively, by "consisting essentially of", and thus, for the purposes of claim support and construction for "consisting of" format claims, such replacements operate to create yet other alternative embodiments "consisting essentially of" only the elements recited in the original "comprising" embodiment to the exclusion of all other elements.

Moreover, any claim limitation phrased in functional limitation terms covered by 35 USC § 112(6) (post AIA 112(f)) which has a preamble invoking the closed terms "consisting of," or "consisting essentially of," should be understood to mean that the corresponding structure(s) disclosed herein define the exact metes and bounds of what the so claimed invention embodiment(s) consists of, or consisting essentially of, to the exclusion of any other elements which do not materially affect the intended purpose of the so claimed embodiment(s).

Devices or system modules that are in at least general communication with each other need not be in continuous communication with each other, unless expressly specified otherwise. In addition, devices or system modules that are in at least general communication with each other may communicate directly or indirectly through one or more intermediaries. Moreover, it is understood that any system components described or named in any embodiment or claimed herein may be grouped or sub-grouped (and accordingly implicitly renamed) in any combination or sub-combination as those skilled in the art can imagine as suitable for the particular application, and still be within the scope and spirit of the claimed embodiments of the present invention. For an example of what this means, if the invention was a controller of a motor and a valve and the embodiments and claims articulated those components as being separately grouped and connected, applying the foregoing would mean that such an invention and claims would also implicitly cover the valve being grouped inside the motor and the controller being a remote controller with no direct physical connection to the motor or internalized valve, as such the claimed invention is contemplated to cover all ways of grouping and/or adding of intermediate components or systems that still substantially achieve the intended result of the invention.

A description of an embodiment with several components in communication with each other does not imply that all such components are required. On the contrary a variety of optional components are described to illustrate the wide variety of possible embodiments of the present invention.

As is well known to those skilled in the art many careful considerations and compromises typically must be made when designing for the optimal manufacture of a commercial implementation any system, and in particular, the embodiments of the present invention. A commercial implementation in accordance with the spirit and teachings of the present invention may configured according to the needs of the particular application, whereby any aspect(s), feature(s), function(s), result(s), component(s), approach(es), or step(s) of the teachings related to any described embodiment of the present invention may be suitably omitted, included, adapted, mixed and matched, or improved and/or optimized by those skilled in the art, using their average skills and known techniques, to achieve the desired implementation that addresses the needs of the particular application.

In the following description and claims, the terms "coupled" and "connected," along with their derivatives, may be used. It should be understood that these terms are not intended as synonyms for each other. Rather, in particular embodiments, "connected" may be used to indicate that two or more elements are in direct physical or electrical contact with each other. "Coupled" may mean that two or more elements are in direct physical or electrical contact. However, "coupled" may also mean that two or more elements are not in direct contact with each other, but yet still cooperate or interact with each other.

It is to be understood that any exact measurements/ dimensions or particular construction materials indicated herein are solely provided as examples of suitable configurations and are not intended to be limiting in any way. Depending on the needs of the particular application, those skilled in the art will readily recognize, in light of the following teachings, a multiplicity of suitable alternative implementation details.

An embodiment of the present invention may provide improved fabrication for molecular devices. Some embodiments may provide a method of the tunnel junction based molecular spintronics device design, where the length of a molecular device channel may be smaller than the combined thickness of the insulating barriers in the planar area of the trench on a conducting strip. This arrangement may enable the molecular device channels to dominate the charge and spin transport via the insulating spacer. In addition, some embodiments may provide a tunnel junction test bed that may be used to allow molecules to perform as the molecular device channels. The insulating spacer between two metal electrodes may take care of the responsibility of maintaining two metal leads physically separated. In addition, some embodiments may provide a fabrication procedure accomplished preferably below 100'C to avoid damage to ferromagnetic electrodes in the ambient condition. TBELMD fabrication procedure may also include fabrication steps, such as annealing of tunnel junction before coupling molecules between two metal electrodes, involving as high as 300° C. in the inert environment. Molecules may be connected to metal leads by the self-assembly in a manner that do not damage the molecules.

Some embodiments may provide an ability to utilize multilayer ferromagnetic electrodes. In addition, some embodiments may provide an ability to make magnetic metamaterials by combining magnetic tunnel junctions and molecular device channels. These TBELMD based metamaterials may have entirely different magnetic, optical, and transport properties as compared to the magnetic tunnel junction and molecules which are utilized for making TBELMD. TBELMD based magnetic metamaterial provide an improved method of producing a molecular device that can exhibit solar cell effect. In the prior work a molecular device where bottom electrode did not possess a trench exhibited solar cell effect. But the prior approach was extremely limited in scope because molecule length must be more than the planar tunneling barrier thickness and under this condition one cannot produce large area solar cell. In addition, some embodiments may provide an ability to make memory devices where the magnetic states of molecules, top magnetic layer, and bottom magnetic layers may be manipulated individually. In addition, some embodiments may provide an ability to utilize molecular "spin" channels for sensing chemicals. In addition, some embodiments may provide an ability to utilize molecular "spin" channels for sensing light.

An aspect of the present embodiment is to detail a trenched bottom electrode based method for making mass producible molecular spintronics devices. An aspect of the present embodiment is to disclose a method of addressing the issues associated with the utilization of ~1 nm length scale molecules. An aspect of the present embodiment may also be to focus on making mass producible molecular spintronics devices.

FIGS. 2A to 2G illustrate the inventor's prior approach showing graphs that may show proof of concept and scope of making magnetic tunnel junction based molecular devices, where FIGS. 2A to C are in reference to a magnometer, FIGS. 2D to E are in reference to a ferromagnetic resonance, and FIGS. 2F to G are in reference to a magnetic force microscopy. The following is an example of a specific aspect in the prior art that, while expected to be helpful to further educate the reader as to additional aspects of the prior art, is not to be construed as limiting the present invention, or any embodiments thereof, to anything stated or implied therein or inferred thereupon. By way of educational background, an aspect of the prior art generally useful to be aware of is that molecules may typically show transformative effect when connected to bottom or first magnetic electrode and the second ferromagnetic electrode. A group of magnetic tunnel junction (MTJ) pillars were studied before and after attaching molecular channels. Each MTJ pillar may typically have been a stack of cobalt (Co)/permalloy(NiFe)/ Insulator (~2 nm AlOx)/NiFe. Molecules utilized in this study may typically have been organometallic molecular complex(OMC) and usually may have possessed ~3 nm end to end length. The core of OMC (inset of FIG. 2A) may conventionally have been connected to four tethers, each ending with —S linker, to typically provide molecule sufficient length and ability to make covalent bond with the metal layer adjacent to insulator. Three independent measurements of the present embodiment were performed to strongly evidence that adding molecule on the magnetic tunnel junction (MTJ) typically produced transformative changes. Magnetometer study was usually conducted on three types of tunnel junctions.

FIG. 2A illustrates a typical magnetization loop from aforementioned bare MTJ turned into linear type after hosting OMCs along the edges. The OMCs established strong antiferromagnetic coupling between the two ferromagnetic electrodes of the tunnel junction leading to observed response in FIG. 2A. OMC impact was typically different for different tunnel junction. OMCs could usually FIG. 2B decrease or FIG. 2C increase the magnetic moment. FIG. 2D illustrates a ferromagnetic resonance study showing OMC normally made the typical resonance modes disappear after getting bridged across insulator of MTJ. In FIG. 2E however, OMCs could usually not impact MTJ that had thickness higher than the molecule length. Additionally, magnetic force microscopy may typically be an approach that seek magnetic signals from the physical magnetic tunnel junction sites (topography panel). FIG. 2F illustrates a topography panel suggesting the usual presence of an array of OMC treated magnetic tunnel junctions. FIG. 2G illustrates a magnetic image panel showing the usual magnetic signal from the magnetic tunnel junctions with OMC bridges, similar to FIG. 1C. OMCs conventionally made a majority of the MTJ lose the magnetic contrast. Dark dots in the dashed line region 205 represent MTJ which were typically not affected by the OMCs. FIG. 2 shows that a magnetic tunnel junction hosting molecule along the exposed side edges can be a useful testbed for harnessing molecules as a device element.

Data shown in panel FIG. 2G exposes two more pertinent typical limitations of the inventor's entire prior approach in the area of molecular device fabrication. For the first limitation Panel FIG. 2G confirms that inventor's prior approach was usually not a high yield process for transforming a large group of tunnel junctions into molecular devices. For the second limitation it is conventionally not enough to make molecular spintronics devices in isolated pillar form without connection to outer world. This pillar form device structure may not typically take the advantage of etching the bottom electrode to reduce the minimum space between top and bottom ferromagnetic layer. As it is obvious, top and bottom ferromagnetic layers may usually be of the same area in a pillar.

Figure 3B:
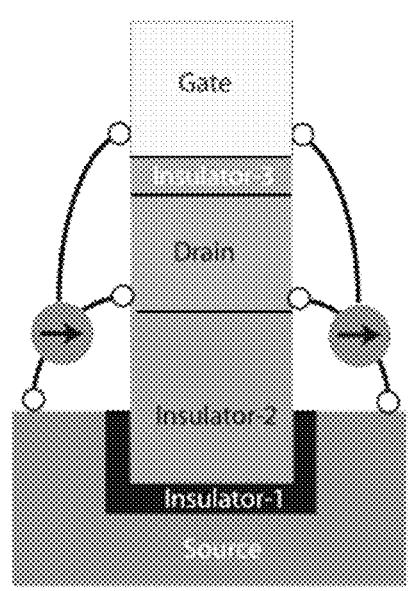
Figure 5A:
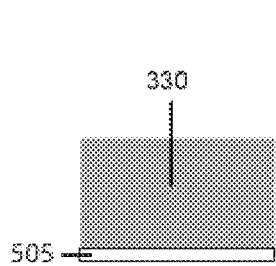
FIGS. 5A-H— illustrate, by way of example, side cross-section views of the components of TBELMD formed at each stage of an exemplary alternative exemplary method (referred to as method "C") for fabrication of a trenched bottom electrode based molecular devices for the cases when bottom electrode will not be oxidized to produce insulator-1, only insulator 325, in accordance with an embodiment of the invention.
Figure 5B:
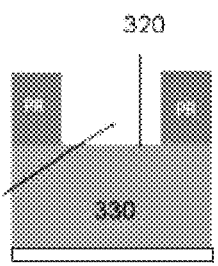
Figure 5C:
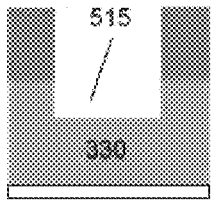
Figure 5D:
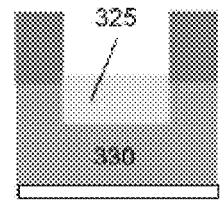
Figure 5E:
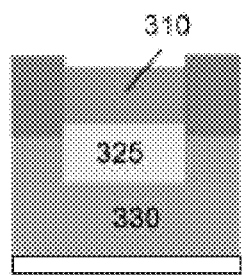
Figure 5F:
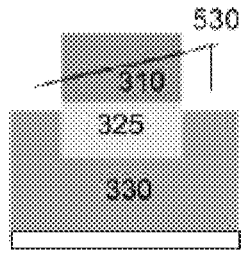
Figure 5G:
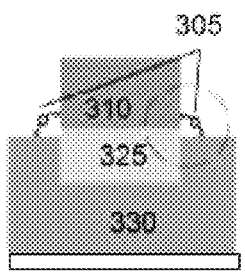
Figure 5H:
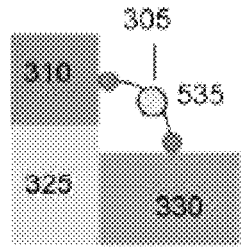

FIGS. 3A and 3B, illustrate cross-sectional views, respectively, of exemplary Trenched Bottom Electrode and Liftoff based Molecular Devices (TBELMDs), wherein FIG. 3A illustrates a device with two terminals and FIG. 3B illustrates a device with three terminals, in accordance with an embodiment of the present invention. FIG. 3A illustrates a two terminal TBELMD 300, in the present embodiment it may primarily be intended to serve as memory device, logic device, light sensor, chemical sensor, biochemical sensor, and logic devices relying on the molecular quantum state. To utilize electron spin for the devices and sensors at least one of the conducting strips may be made up of magnetic material. Magnetic materials may be nickel, iron, cobalt, and magnetic alloys like NiFe and CoFeB etc. Conducting strips may contain films of multiple materials to realize different magnetic hardness. Selection of magnetic materials like nickel may produce the direction of magnetic moment parallel to the plane of the films, as illustrated in FIG. 3A. However, CoFeB may produce direction of magnetic moment perpendicular to the plane of the films. Molecular channels 305 may be bridged between two conducting strips 310 and 330 to transform a magnetic junction into molecular spintronics device 300. The cross-section side view along the second conducting strip shows a more pertinent feature of this invention. A first conducting strip 330, also referred as a bottom electrode, may possess a trench 320. Trench 320 is the area in 330 bottom electrode that was removed and then filled with at least one insulator to ensure that conducting strips 310 and 330 are not directly in contact with each other. In the exemplary drawing FIG. 3A, the trench region 320 is filled with a portion of the insulator-2 315. At least one insulator 325 may be accommodated in the trench 320. The thickness and width of an insulator-1 325, thickness of an insulator-2 315, and depth of the trench 320 may be adjusted to accommodate very small molecules with less than 1 nm length to very large molecule of even more than 10 nm length. As a design merit the leakage current via the insulator-1 325 and insulator-2 315 may be extremely low and typically less than 1 mA/cm$^2$ tunnel junction area. In a 25 micron (5 um×5 um) junction area, an extremely low current should be smaller than 1 nA. Low leakage current may enable molecules to dictate the charge and spin transport via them. As a more pertinent attribute, the combined thickness of insulator-1 and insulator-2 may be significantly more than that of the target molecule length. A thick insulator in the planar area may reduce the adverse impact of defects on the molecular spintronics device performance and long-term stability. Setting the alignment of free ferromagnetic layer 310 parallel to the pinned layer 330 may give a high current flow, however the antiparallel state may set the low current state. FIG. 3B illustrates a three-terminal version of the TBELMD 300 that may serve as a logic device.

FIGS. 4 A to N illustrate, by way of example, side cross-section views of the components of TBELMD 300 formed at each ordered stage of an exemplary fabrication method for producing trenched bottom electrode based molecular devices, wherein FIGS. 4 A-D illustrate the initial stages in common, FIGS. 4 E-I illustrate subsequent stages done according to an exemplary alternative exemplary method "A", and FIGS. 4 J-N illustrate those stages done instead according to an exemplary alternative exemplary method "B", all in accordance with embodiments of the invention trenched bottom electrode may enable four forms of tunnel junctions based molecular devices. Two approaches (method. A and method. B) are discussed in this figure; however, remaining two approaches (method C and method D) are discussed in NG. 5 and FIG. 6.

Top row of this figure shows the steps for the two schemes, in accordance with an embodiment of the invention. In a step (1) a bottom electrode 330 may be deposited on an insulating substrate 405 In a step (2) photolithography may be used to create window 410 in photoresist layer for creating a trench 320 in the bottom electrode 330. In a step (3) a desired dimensions 415, shown by the rectangle with dash lines, of the bottom electrode 330 may be removed. The amount of material to be removed 415 to create a trench 320 may be determined based on the type of molecular device elements. Any molecule that can be functionalized to make chemical bonds with the conducting strips is suitable for making TBELMD 300, Some example molecules are porphyrin, single molecular magnets, organometallic molecules, proteins, alkanes, single ion molecules, etc. In a step (4) a bottom electrode surface metal 420 may be oxidized to create the insulator-1 325. After this step two methods of molecular devices described as method A and method B. For method A, illustrated by way of example in FIGS. 4 E-I, an insulator-2 315 may be deposited in such a manner that insulator-2 315 thickness may be lesser than the trench 320 depth. Trench 320 depth may range from ~0.2 nm to 10 nm and will depend on the length and type of targeted molecule. In a step shown in FIG. 4F a top conducting metal electrode 310 may be deposited on the top of the insulator-2 315. In a step shown in FIG. 4G liftoff of photoresist may produce a tunnel junction 425 with the exposed side edges. In a step shown in FIG. 4H molecules of interest 430 may create charge and spin conduction bridge between two metal electrodes 305 along the two exposed edges of the tunnel junctions 425. The zoomed in view of the molecular channel 305 where molecules 430 connect between two metal electrodes 310 and 330 is shown in FIG. 4I. The separation between two electrodes 310 and 330 may be governed by the thickness of the insulator-1325. This approach may be expected to be useful for the small molecules of ~1 nm length scale. For the large molecules of 2-10 nm method B may be more useful. Small molecules list may include alkane molecules consisting of 6-2.0 carbon atoms, porphyrins, inorganic molecules etc. Long molecules may be long chain alkanes, proteins, polymeric chain, DNA etc. For method B, a step (B-1) focuses on depositing the insulator-2 315 in such a manner that insulator-2 315 thickness may be more than the trench 320 depth. Insulator-2 315 thickness will depend on target molecule length 440. In a step (B-2) a top conducting metal electrode 310 may be deposited on the top of insulator-2 315. In a step (B-3) photoresist liftoff may be used to produce tunnel junction with the 435 exposed side edges. In a step (B-4) molecules of interest may be bridged between two metal electrodes 310 and 330 along the two exposed edges of the tunnel junctions 435. The zoomed in view of the area where molecule 440 connects between two metal electrodes to form the molecular conduction channels 305 is shown in (A-5). The minimum separation between two electrodes 310 and 330 along the junction is governed by the thickness of the insulator-1 325 and the insulator-2 315.

FIGS. 5 A-H illustrate, by way of example, side cross-section views of the semiconductor structures formed at each stage of an exemplary alternative exemplary method (referred to as method "C") for fabrication of a trenched bottom electrode based molecular devices for the cases when bottom electrode cannot be oxidized to produce insulator-1 325, in accordance with an embodiment of the invention. For example, a bottom electrode 330 may be made up of gold, palladium, and platinum like inert metals and semiconductor like gallium arsenide (GaAs), germanium, indium arsenide, and alloyed semiconductors. For this case: in a step shown in FIG. 5A a $1^{st}$ metal strip 330 may be deposited on an insulating substrate 505. In a step shown in FIG. 5B photolithography may be used to produce a window 510 in the photoresist for creating a trench 320 in the 1st strip 330 or bottom electrode. In a step shown in FIG. 5C a desired thickness 515 may be removed from the bottom electrode 330, an amount of material removed may be determined based on the type of molecular device elements. In a step shown in FIG. 5D an insulator 325 may be deposited in such a manner that insulator 325 thickness may be more than the trench 515 depth. In a step shown in FIG. 5E a top conducting metal electrode 310 may be deposited on the insulator 325. In a step shown in FIG. 5F liftoff photoresist may be used to produce a tunnel junction with the exposed side edges 530. In a step shown in FIG. 5G molecules of interest 535 may be bridged between two metal electrodes in the region 305 along the two exposed edges of the tunnel junctions 530. The zoomed in view of the area where a molecule 535 may connect between two metal electrodes in the region 305 is shown in FIG. 5R. The separation between two electrodes 310 and 330 may be governed by the thickness of the insulator 325 popping out of the trench 515.

FIGS. 6 A-I illustrate, by way of example, side cross-section views of the components of TBELMD 300 formed at each stage of an exemplary alternative exemplary method (referred to as method "D") for fabrication of trenched bottom electrode based molecular devices for the cases when bottom electrode 330 cannot be oxidized to produce insulator-1 325, in accordance with an embodiment of the invention. Instead, insulator-1 325 may be deposited by attaching molecular monolayer via self-assembly. For this case: in a step shown in FIG. 6A a first electrode 330 may be deposited on an insulating substrate 605, In a step shown in FIG. 6B photolithography may be used to create window 610 in photoresist for creating a trench in the first electrode 330, In a step shown in FIG. 6C a desired thickness 615 of the first electrode 330 may be removed, an amount of material removed may be determined by the type of molecular device elements. In a step shown in FIG. 6D small molecules may self-assemble to create insulator-1 620. In a step shown in FIG. 6E a second insulator 625 may be deposited in such a manner that insulator thickness may be more than the trench depth. In a step shown in FIG. 6F a second conducting metal electrode 630 may be deposited on the insulator. In a step shown in FIG. 6G liftoff of photoresist may be used to produce tunnel junction with the exposed side edges 635. In a step shown in FIG. 6H molecules of interest 640 may be bridged between two metal electrodes along the two exposed edges of the tunnel junctions. The zoomed in view of the regions where molecule 640 connects between two metal electrodes is shown in FIG. 6I. The separation between two electrodes may be governed by the thickness of the 625 insulator popping out of the trench.

Figures 7A, 7B, 7C, 7D, 7E, 7F, 7G, 7H:
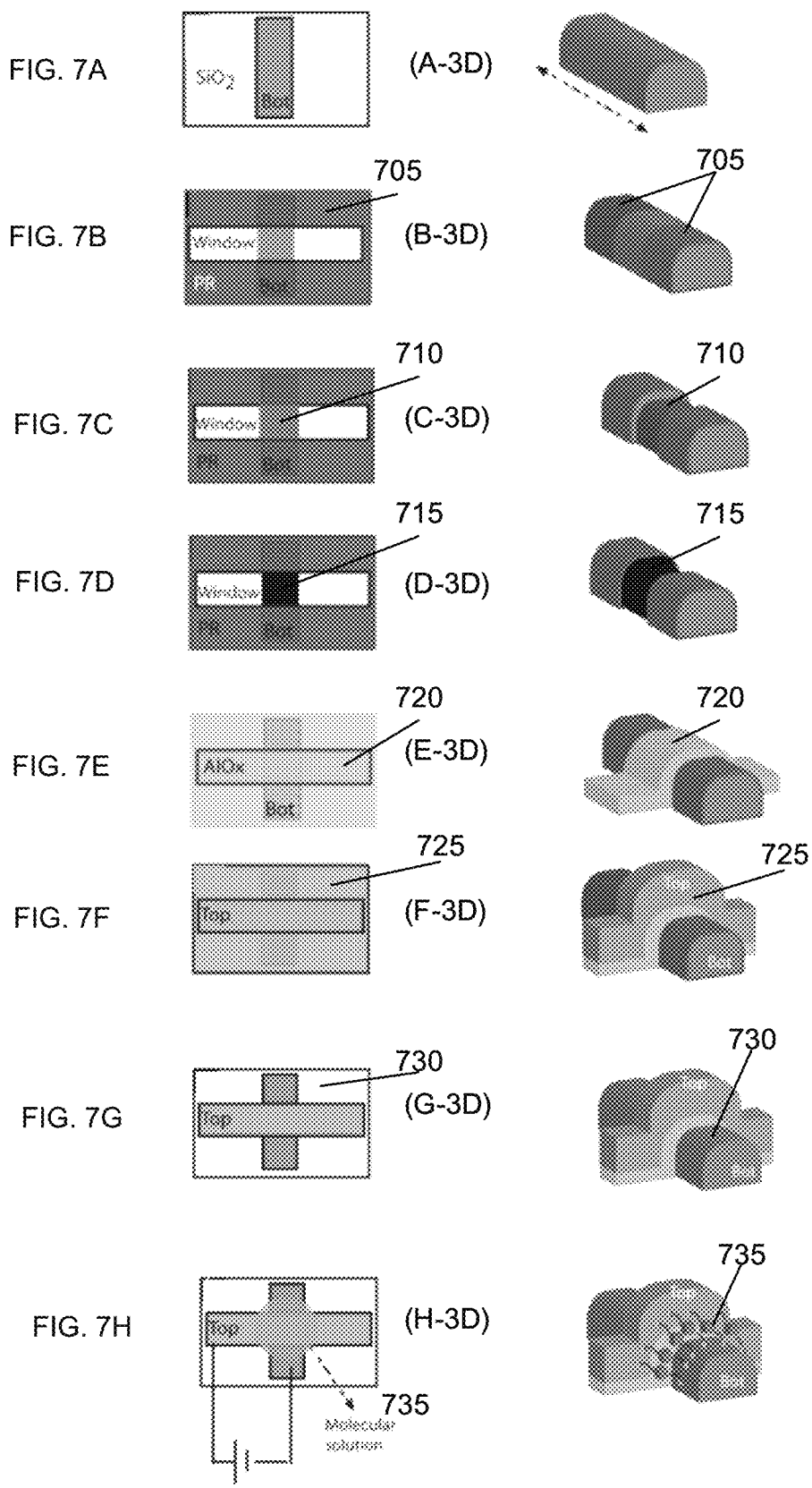
FIG. 7 A to H illustrate, by way of example, various top and side perspective views of the components of TBELMD formed at each stage of an exemplary process flow for creating the exemplary trenched bottom electrode based molecular devices, in accordance with an embodiment of the invention.

FIG. 7 A to H illustrate, by way of example, various top and side perspective views of the components of TBELMD formed at each stage of an exemplary process flow for creating the exemplary trenched bottom electrode based molecular devices, in accordance with an embodiment of the invention. This process flow is for "A" method as discussed in FIG. 4. For other three methods B, C, D shown in FIG. 4, FIG. 5, FIG. 6, respectively, the same process flow will be applicable, but difference will be in the insulator growth step after etching. Top view and corresponding 3D view of the process flow for creating the trench based molecular devices are shown. In a step (FIG. 7 A) a first conducting strip may be deposited with tapered edges. Tapered sides of the first electrode may ensure that any anomaly on the edge do not damage the insulators. In a step (FIG. 7 B) photolithography may be conducted to create a window in the photoresist. The window in photoresist may be crucial for matching the lateral dimension of at least one insulator and at least one metal strip that may be deposited on the first metal strip for completing tunnel junction. It is noteworthy that in the 3D view, the photoresist protected region of the first metal strip is shown by the dark area 705 to simplify the viewing of different materials. In a step (FIG. 7C) a trench in the first metal strip 710 may be formed by etching away material from the top of the first metal strip from unprotected region. Trench depth may be controlled to facilitate the bridging a desired molecule between the first and the second metal strips. In a step (FIG. 7D) the trench region the first insulator (Insulator-1) 715 may be created by the plasma oxidation of the first metal strip or by adding a monolayer of insulating molecules by the self-assembly process. In a step (FIG. 7E) a second insulator (insulator-2) 720 may be deposited on the top of the insulator-1 surface. Insulator-2 may be alumina (AlOx), magnesium oxide (MgO), silicon di oxide, silicon nitride etc. In a step (FIG. 7F) a second metal strip 725 was deposited on the top of at least one insulator. In a step (FIG. 7G) photoresist layer and the materials sitting on the photoresist may be removed by the liftoff step. Liftoff may result in the tunnel junction testbed with the exposed side edges 730. In a step (FIG. 7H) finally a junction is submerged in the molecular solution to connect molecular bridges 735 between the first and the second metal strip.

FIGS. 8 A-E illustrate side cross-section views of the before, during, and after states of exemplary molecules for the exemplary molecular device during the exemplary method of attaching molecules shown in FIG. 7 for the present molecular device, where FIG. 8A illustrates molecules 800 before and after protection group 805 to release thiol groups 820, FIG. 8B illustrate molecules randomly floating around tunnel junction after submerging the tunnel junction with exposed side edges 530, FIG. 8C illustrate electrophoretically concentrating molecules 800 near a junction, FIG. 8D illustrate and removing protection group from thiol to facilitate metal-molecule chemical bonding FIG. 8E illustrate formation of thio-metal chemical bonding to create molecular bridges 535 all in accordance with an embodiment of this invention. FIG. 8 illustrates the structure of a molecule to be incorporated in the molecular device and method of attaching them between the first and second metal strip. In a step (FIG. 8A) molecules to be used for the TBELMD may have a core 815 with switchable quantum state, tethers 810 to provide sufficient length to overall molecule, thiol like functional groups to form chemical bonding with metal electrodes, and acetate like protection groups 805 to inhibit undesirable interaction of thiol functional groups 820 with other molecules. This molecular core 815 may allow the quantum state of a molecule to become the part of a TBELMD. The molecule's core may possess controllable and novel magnetic, optical, and transport characteristics. To harness a molecule's core attributes in the device at least two tethers 810 may be attached to the molecule core. Adding tethers to core may make an overall molecule length suitable for bridging them between the two metal stripes 310 and 330. However, a tether 810 itself may be unable to make chemical bond with the metal layers 310 and 330. Hence, it is more pertinent that each tether 810 should end with the thiol functional group 805 or a suitable anchoring group to establish chemical bonding with the metal strips. For example, thiol functional group may form strong covalent bond with the ferromagnetic metal layer. However, in some cases thiol functional group 805 may interact with molecule core 815 or with other thiol functional groups to form di sulfide bonds. To prevent undesirable interactions of a thiol functional group they may be protected by easily removable protective functional group 805. Protective functional group 805 may be removed by electrochemical method or by adding NaOH like base. The method of attaching a molecule between the first 330 and second 310 metal strip may be accomplished as shown in the cross-sectional view of the device. In a step (FIG. 8B) a tunnel junction with exposed side edges 530 may be submerged in the molecular solution with sufficient concentration. In a step (FIG. 8C) an electric field may be applied to accumulate molecules 800 near the junction area. Prior patent describe the method of utilizing electric field to mobilizing the molecules between the metal electrodes (Heller, Gilbert et al. 2004, U.S. Pat. No. 6,778,853 B1). In a step (FIG. 8D) thiol or other anchoring groups 820 of the molecules may be freed from the protective chemical groups 805 by adding NaOH or by applying the suitable voltage on the first and second metal strips 330 and 310. The details of different protective groups and methods of deprotections may be described in the patent by (Freeman and Pisharody 2005, WO 2004061416 A3). In a step (FIG. 8E) molecules with free thiol or similar anchoring group 535 bond with the metal leads to establish conduction bridges. FIG. 8 also represent the method of attaching molecules for the other variations of TBELMD shown in FIG. 4-6.

Figure 9A:
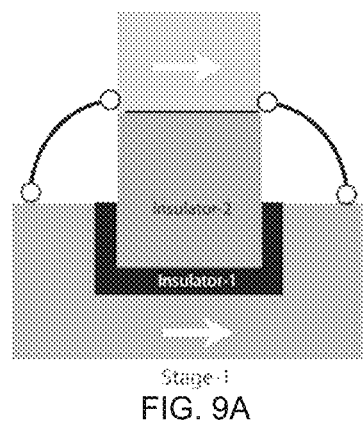
FIGS. 9 A-D illustrate a cross sectional view along a bottom layer of an exemplary TBELMD based molecular spin valve device during the mechanism of a two terminal TBELMD serving as an exemplary spin valve type memory device, where FIG. 9 A and FIG. 9 B illustrate Alkane like simple molecular device elements, and FIG. 9 C and FIG. 9 D show molecules with tunable quantum states, all in accordance with an embodiment of the invention.
Figure 9B:
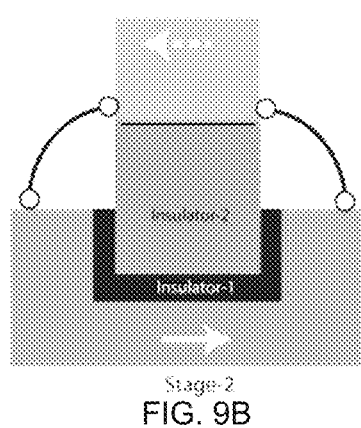
Figure 9C:
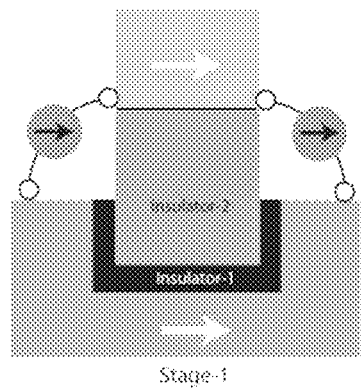
Figure 9D:
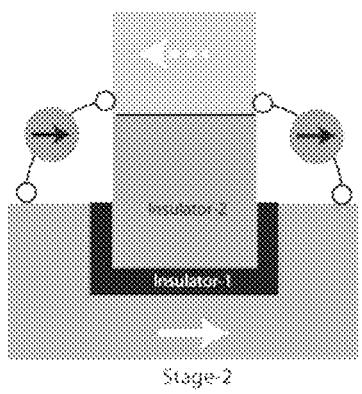

FIGS. 9 A-D illustrates a cross sectional view along a bottom layer of an exemplary TBELMD based molecular spin valve device during the mechanism of a two terminal TBELMD serving as an exemplary spin valve type memory device, where FIG. 9A and FIG. 9B illustrate alkane like simple molecular device elements, and FIG. 9C and FIG. 9D show molecule with tunable quantum states as shown in FIG. 9A, all in accordance with an embodiment of the invention. The disclosed molecular device method may produce high magneto resistance ratio for application in magnetic random access memory. The use of simple alkane molecules to high functionality molecules with tunable quantum state may be possible. Simple alkane molecules may be connected between the two ferromagnetic metal strips. Due to the low spin orbit coupling and Zeeman splitting the alkane molecule may serve as superior spin pathways than that of insulator-1 and insulator-2. Also, resistance of the short chain alkanes may be much smaller and may require less operational power. Alkanes molecules may be also virtually defect free and hence enable long spin coherence length and time. In addition, the proposed molecular device approach may allow the deposition of the first and second metal strip made up of single or multiple layers of materials. The anisotropy and magnetic coercivity may be controlled to switch the direction of magnetization of the second metal strip. The magnetization of the first metal strip may be pinned. The molecular device discussed herein may demonstrate bistable resistance state—that is basis for utilizing such devices as the memory units. First and second metal strip may also utilize CoFeB magnetic materials that will enable direction of the magnetic moments to be perpendicular to the plane of the metal strips. In the first stage (FIG. 9A) by the application of external magnetic field the magnetization of the second metal strip may be aligned parallel to the direction of the magnetization of the first metal strip. In this state the molecular device may be in the lowest current state. In the second stage (FIG. 9B) similarly, the application of external magnetic field may set the magnetization of the first and the second metal strips in the opposite direction to set the device in the high resistance state. The ratio of difference between high and low resistance values to the high resistance may produce characteristics magneto resistance ratio for a molecule.

Replacing the simple alkane molecules with a molecule that possess a switchable molecular core may exhibit multiple magneto resistance ratio. The application of light, heat, and magnetic field may selectively change the quantum state of the molecular core. For every quantum state at the core the direction of the magnetization of the second metal strip may be set parallel (FIG. 9C) and antiparallel (FIG. 9D) to the direction of magnetization of the first metal strip. The magneto resistance ratio, calculated by taking the ratio of the difference of resistance in the low and high state to high resistance of the device, may be different for each quantum state of the core of the molecule. The application of light, heat, and magnetic field to maneuver the molecular quantum state may be analogous to the utilization of gate electrode in the field effect transistors.

Two terminal TBELMD involving small paramagnetic molecules can produce spin based solar cell. The prior work discussed in FIG. 2 leaded to solar cell effects (P. Tyagi, "Spin Photovoltaic Effect on Molecule Coupled Ferromagnetic Films of a Magnetic Tunnel Junction," ASME International Mechanical Engineering Congress and Exposition, vol. 6B: Energy, p. V06BT07A039, 2013). However, prior molecular device fabrication approaches shown in FIG. 2 were incapable of producing large area molecular devices due to limitation on the insulator of magnetic tunnel junction. In the prior work thickness of insulator between two ferromagnetic films had to be smaller than the molecule length. The typical desirable molecule length is 1-3 nm range. Due to that limitation prior molecular devices become fragile when area was increased. The TBELMD invention disclose here enables the utilization of paramagnetic molecules promising for producing solar cell effect without imposing any limit on the thickness of insulator between two ferromagnetic electrodes. TBELMD based solar cell typically utilize two 5-20 nm thick ferromagnetic layers of significantly different magnetic coercivity. The role of paramagnetic molecules is to strongly couple the wave functions of the two ferromagnetic metal electrodes in a TBELMD. Under strong coupling effect TBELMD produces new magnetic properties similar to those discussed in the FIG. 2 regarding prior molecular device work by the inventor. The molecule mediated exchange coupling result into a light radiation sensitive magnetic layer in a TBELMD. This radiation sensitive TBELMD emerges due to high degree of spin density exchange between the two ferromagnetic electrodes that produces a resultant diode like behavior. This phenomenon is akin to p-n junction formation in a regular solar cell. However, in a TBELMD spin up and spin down atoms and electrons play the roles of the positive and negative ions and electrons in a charge-based p-n junction solar cell. This molecule impacted area absorb light radiation. While diode like characteristics are associated with the TBELMD's ability to move light radiation generated spin up and spin down electrons in the opposite direction. Hence, under light radiation this TBELMD's diode characteristic enables the separation of spin up and spin down electron to produce a net current flow of spins in the TBELMD. The inventor's prior work illustrates the science behind the functioning of spin based solar cell (P. Tyagi, "Spin Photovoltaic Effect on Molecule Coupled Ferromagnetic Films of a Magnetic Tunnel Junction," ASME International Mechanical Engineering Congress and Exposition, vol. 6B: Energy, p. V06BT07A039, 2013). TBELMD approach provides a robust method of producing spin based solar cell.

FIG. 10 A to J illustrate, by way of example, various top and side perspective views of an exemplary three terminal TBELMD where a third metal electrode serves as a Gate, at each stage of an exemplary process flow for creating, in accordance with an embodiment of the invention. FIG. 10 illustrates an exemplary method of producing field effect based molecular device. The ability to maneuver the molecular quantum state with the field effect may require the presence of a gate insulator and Gate metal strip in addition to the first and second metal strips. Molecules may make simultaneous contact with the first, second, and the gate electrode or third metal strip.

The first and the second metal strip in the two terminal tunnel junction based molecular device may be analogous to the source and drain contacts present in the conventional CMOS type field effect devices. With reference to FIG. 7, design and fabrication of the proposed field effect molecular device may be based on the design and fabrication of the two terminal trenched first electrode based molecular device disclosed in the FIG. 7. With reference to FIG. 7, the FIG. 10(A-E) steps are exactly same as discussed in the description of FIG. 7(A-E). To produce the gate dielectric layer and the third metal strip the photolithography window 1005 that may be used for making the trench 1010, depositing insulator-1 1015, insulator-2 1020, and the second metal strip 1025 may have been utilized. An advantageous aspect of employing the first photoresist window may be that the lateral dimensions of the gate dielectric and the third metal strip may be the same as that of metal strip 2. Panels FIG. 10A-F and corresponding 3D views show the process steps up to the deposition of the second metal strip, and before the liftoff of the photoresist. Panel FIG. 10G shows the method of covering one side the second metal strip 1025 and the first photoresist layer with a second layer of photoresist 1030. Panel FIG. 10H shows the deposition of gate dielectric film or the third insulator 1035 on the top of the second metal strip 1025. Panel FIG. 10I and corresponding 3D view shows the deposition of the third metal strip or the gate electrode 1040 before the liftoff step. Panel FIG. 10J shows the top view and 3D view of the complete tunnel junction with the third metal strip 1040. Panel FIG. 10J shows liftoff photoresist and protection on the left side of the ferromagnetic electrode to produce tunnel junction 1045 for spin field effect transistor (SPINFET). This form of molecular device was realized after the liftoff of the two photoresist layers and materials sitting on it. With reference to FIG. 11; the description of the required form of the molecule and the method of bonding the same molecule to the three metal strips is discussed in the FIG. 11.

FIGS. 11 A-F illustrate top, side perspective and cross sectional views of a required exemplary form of the TBELMD with three terminals and required exemplary form of the molecule and the method of bonding the same molecule to the three metal strips to form the field effect based molecular devices, where the top view (FIG. 11A) shows the submerging of the junction into a molecular solution for chemically bonding of the molecule with the metal strips that may, side perspective view (FIG. 11B) shows the 3D side view of the junction, and cross sectional view (FIG. 11C) shows electrophoretically concentrated molecules near a junction, (FIG. 11D) shows selective removal of protection group-1 1120 to connect a molecule to source and drain metals, (FIG. 11E) shows bonding of 1115 with the source and drain metal electrodes, (FIG. 11F) shows selective removal of protection group-2 1135 by applying a bias on Gate electrode, (FIG. 11F) shows a long tether 1125 getting attached to a Gate electrode via anchoring group 1130, all in accordance with an embodiment of the invention. FIG. 11C also shows the desired form for a molecule that may be bonded to the three metal strips. A target molecule may possess at least two relatively short tethers 1110 coming out of the core 1105 of the molecule and terminated with thiol like anchoring group 1115. Relatively short tethers are only capable of bridging the insulating gap 1020 and 1015 between bottom electrode 1010(first) and middle metal (second) electrode 1025. Short tethers 1110 will not be able to simultaneously bond between bottom electrode 1005 and the top metal Gate electrodes 1035. Short tethers 1110 may form a molecular bridge between the bottom 1005 and middle ferromagnetic electrodes 1025. The thiol anchoring terminal 1115 may be protected by a protective group that is referred as protective group-1 1120. Upon the selective removal of protective group-1 1120 thiol terminal group 1115 may be freed to chemically bond with the first metal strip 1005 and second metal strip 1025. The target molecule may also possess at least one long tether 1125 coming out of its core 1105. From core 1105 is also connected to at least one long tether molecule 1125. The long tether 1125 is terminated with a thiol like terminal group 1130 to specifically bond with the third metal strip or the gate electrode 1035. The length of long tether may depend on the thickness of the second metal strip 1025 and the thickness of insulator-3 1030. The terminal group of the long tether 1130 may be protected by protection group-2 1135 to avoid undesired interaction of the terminal group 1130 with the core 1105 and with other terminal group 1105 to form disulfide type bonds. However, protection group-1 1120 and protection group-2 1135 may be designed to remove under different conditions to allow selective interactions.

Alternatively, one may attach different thiol like anchoring groups at the end of each tethers 1110 and 1125, but protect them by the same protection group. Cross sectional view FIG. 11C shows the tunnel junction with the gate dielectric (insulator-3) 1030 and the third metal strip (gate metal electrode) 1035. FIG. 11C also shows the mechanism of driving desired molecules close to the junction area where metal electrodes 1005 and 1025 are physically separated by insulator-1 1015 and insulator-2 1020. An electric field may be created near the junction of the first 1005 and second 1025 metal strips. The application of electric field may electrophoretically drive the molecules towards the junction and increases the molecular concentration in the junction vicinity-even when a diluted molecular solution is used. Details of molecule mobilization are discussed in the prior patent (Heller, Gilbert et al, 2004, U.S. Pat. No. 6,778,853 B1) where the use of electric field may be used for driving nanostructures. Panel FIG. 11E shows the process of selectively removing protection group-1 1120. To enable metal-molecule bonding the first protection group 1120 may selectively be removed to free up the thiol like terminal groups 1115 present at the end of short tethers 1110. Adding, NaOH into molecular solution and the application of suitable voltage on the metal strips may be highly effective in removing the protection group 1120. One can also utilize $NH_4OH$ and KOH to remove protection group. Panel FIG. 11E described the bridging of the molecule between the first and the second metal strips 1005 and 1025. The thiol like terminal group 1130 at the end of the long tether 1125 may still be protected. Panel FIG. 11 F describes the process of connecting the molecule to the gate electrode or the third metal strip 1035. The thiol like terminal group 1130 present at the end of the long tethers 1125 may be freed by selectively removing the protection group-2 1135. The discussion about various protection groups and several approaches to remove them controllably is discussed in the prior patent (Freeman and Pisharody 2005, WO 2004061416 A3) and the references therein (e.g. P. G. Wuts: Protective Groups in Organic Synthesis, 5th ed. (Wiley 2006)). The free thiol like terminal group 1130 may be bonded to the third metal strip 1035 by applying suitable voltage on the third metal strip. After this process a molecule may be connected to the three metal strips of the tunnel junction and ready to be used as a field effect based molecular device.

Figure 12A:
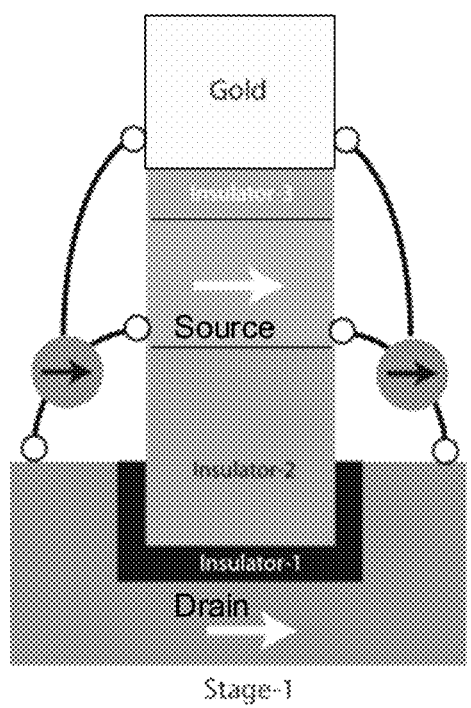
FIG. 12A shows stage-1.
Figure 12B:
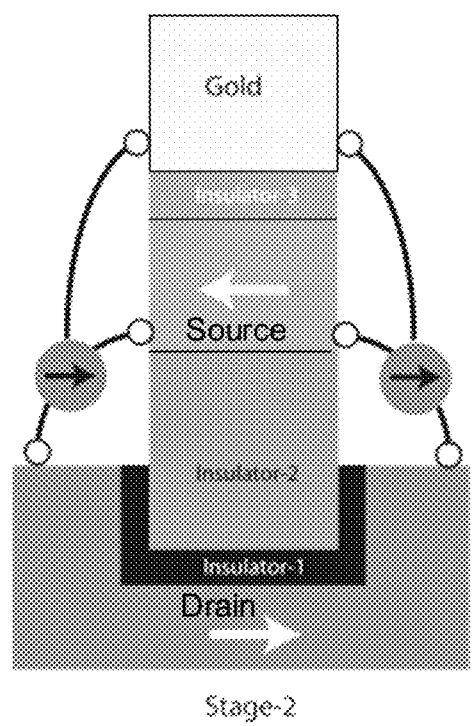
FIG. 12B shows stage-2, in accordance with an embodiment of the invention.

FIGS. 12 A and B illustrate cross sectional views of an exemplary three terminal molecular device serving as a logic device, where FIG. 12A shows stage-1, and FIG. 12B shows stage-2, in accordance with an embodiment of the invention. A molecular device with three terminals may work as a field effect transistor. For this device a molecule may be specially designed to possess a third tether. This third tether may be chemically bonded to the top Gate electrode as shown in panel FIG. 12 A. This molecular device may allow an application of electric field via the gate electrode to maneuver the molecular energy levels. The gate electrode may switch the quantum state of the molecule. For every molecular quantum state current-voltage characteristics may be recorded. In this molecular device the first and the second metal electrode may work as source and drain. The source and drain or the first and second metal strip may be made up of ferromagnetic materials. The magnetization of the first ferromagnetic layer may be pinned or fixed. However, the magnetization of the second ferromagnet may be free to rotate with the help of external magnetic field. In this TBELMD configuration shown in FIG. 12, one ferromagnetic film will serve as a source (e.g. Source electrode) while other ferromagnetic film will serve as a sink of spin or (e.g. Drain electrode). Spin transport via molecule is in the low resistance state when the magnetization of the source and drain may be parallel to each other. On the other hand, the spin transport via molecule may be in the high resistance state when the magnetization of the source and drain is aligned in the opposite direction. These high and low resistance states may be impacted by the molecular quantum state participating in the spin transport. The gate electrode may enable the manipulation of the molecular quantum state and yielding a spin based field effect transistor for molecular logic devices. Since the molecular channels are exposed to the open environment the device structure disclosed here may also serve as the spin based field effect transistor, chemical sensor, bio chemical sensor, and energy sensor etc.

For the TBELMD shown in FIG. 12, the gate metal electrode can flip the spin direction of the electron present in the molecular channel by Rashba like effect. The spin up and spin down states of the electron in the molecular channel will result in the TBELMD's on and off states.

The disclosed TBELMD in FIG. 12 with three terminals may function like a variable molecular state spin field effect transistor-based logic device. In this case the ferromagnetic bottom metal electrode and the ferromagnetic middle metal layers are connected to a molecule that can change its spin state. Here, ferromagnetic metals will serve as a source and detector (Drain) for the spin of the electrons. However, gate electrode will change the magnitude of the spin state of the molecule. Many device states will result due to gate tunable molecular quantum states. For example a Mn12 like single molecular magnet molecule can acquire spin states from +10,+9, +8,+7, +6,+5,+4,+3,+1, 0, −1, −2,−3,−4,−5,−6,−7,−8,−9,−10. Mn12 molecule can be employed in a TBELMD shown in FIG. 3. Controllably switching the molecular quantum states for Mn12 in those 20 states will produce 20 device states that can be used for the logic operation in a single TBELMD.

Three terminal TBELMD shown in FIG. 12 can work as a testbed for quantum computation devices. The disclosed TBELMD will serve as a highly robust testbed to forming the quantum computation device with promising molecules. The single ion molecules (Y.-S. Ding, Y.-F. Deng, and Y.-Z. Zheng, "The rise of single-ion magnets as spin qubits," *Magnetochemistry*, vol. 2, p. 40, 2016.) and single molecular magnets (E. Coronado and A. J. Epsetin, "Molecular spintronics and quantum computing," *J. Mater. Chem.*, vol. 19, pp. 1670-1671, 2009.) have been projected for the quantum computation. However, there exists a technological gap for developing the method of integrating molecule into a robust and mass producible device for quantum computation. The TBELMD's gate metal electrode may electrically drive nuclear spin resonance in single molecular magnet to enable quantum computation operation. In TBELMD approach a molecule is interfaced to the source and drain terminals of the TBELMD. The electric field from the gate electrode of the TBELMD can be easily focused and shielded in the small volume to affect the molecular device states.

TBELMD can simultaneously function as a logic and memory device to give the effect of two in one device. The three terminal TBELMD shown in FIG. 12 can simultaneously function in dual modes—as a logic device and as a memory device. To serve as inbuilt memory device the bottom ferromagnetic electrode may have fixed or pinned magnetization. On the other hand, the middle ferromagnetic metal layer may be soft and free to rotate magnetic moment. Aligning the magnetic moment of the two ferromagnetic layers parallel to each other will produce high current via the molecule and will correspond to binary 1 or ON state. Aligning the magnetic moments of the two ferromagnetic electrodes antiparallel to each other will produce low current state and this device state will correspond to binary 0 or OFF state. In each of the condition, when two ferromagnetic layers will be parallel or antiparallel to each other, the gate electrode of TBELMD can influence the transport via molecule to enable the separate ON and OFF states for the logic operation. Hence, gate will enable ON and OFF states when TBELMD have parallel magnetic moments of the magnetic layers. Gate will also enable ON and OFF states when TBELMD have antiparallel magnetic moment of the magnetic layers. This dual function TBELMD will have inbuilt magnetic random-access memory.

Figure 13:
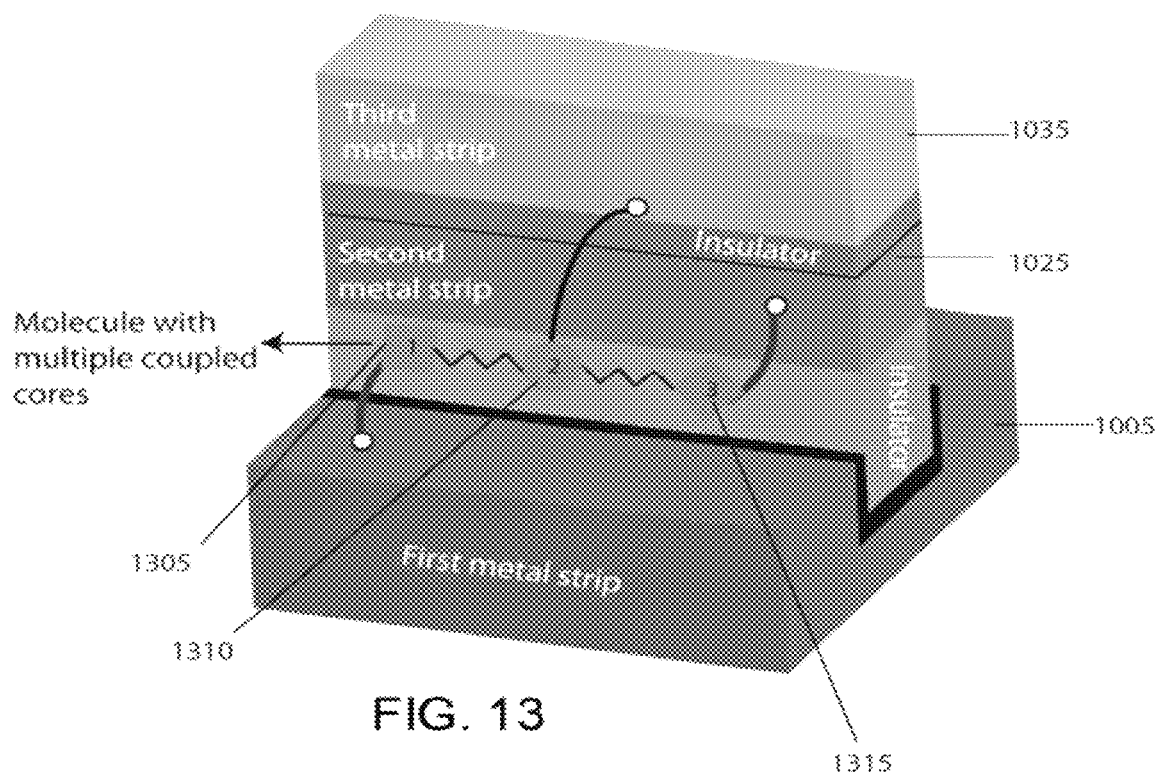
FIG. 13 illustrates a side perspective view of an exemplary three terminal TBELMD utilizing multicore molecule for producing novel computer devices, energy sensors, and chemical sensors, in accordance with an embodiment of the invention.

TBELMD shown in FIG. 12 may function as a three-terminal charge based computer logic device. The disclosed TBELMD with three metallic terminals may function like a classic complementary metal oxide semiconductor (CMOS) computer logic device. However, this TBELMD will be based on the charge transport via the molecular channel. In this case, all the three metal electrodes are connected to the each molecule. These three metal electrodes will be made up of nonmagnetic conducting metals or highly conducting semiconductors. Nonmagnetic metals and conducting semiconductor may be made up of gold, silver, copper, highly doped silicon, titanium, tungsten etc. The trenched bottom electrode and the middle metallic electrode will serve as the source and drain electrodes. The top metal lead will serve as the Gate electrode to electrostatically maneuver the molecular energy levels. Controlling the molecular energy level via gate electrode set a TBELMD in the "ON" and "OFF" state. The conduction between source and drain will occur via quantum tunneling FIG. 13 illustrates a side perspective view of an exemplary three terminal TBELMD utilizing multicore molecule for producing novel computer devices, energy sensors, and chemical sensors, in accordance with an embodiment of the invention. This approach may provide a practical route to make unimolecular structure based devices. Complex molecules with three parts 1305, 1310, and 1315 may serve as source, drain, and gate component of unimolecular field effect device. In this device TBELMD may utilize nonmagnetic metal electrodes or strips 1005, 1025, and 1035 to focus on charge property of electron. The in depth discussion about the description and mechanism of unimolecular device element is discussed in the prior patent (Ellenbogen 2002, U.S. Pat. No. 6,339,227 B1). This prior patent describes the design of a big unimolecule comprising of at least three parts. The three parts of an unimolecule serve the role of source, drain and gate electrodes (Ellenbogen 2002, U.S.

Pat. No. 6,339,227 B1). However, in the prior patent no details about the method of forming molecular device were discussed. According to best of our knowledge no experimental method has been successful in producing unimolecular based devices. TBELMD invention provides a viable approach to fabricate unimolecular based devices.

This TBELMD approach may also provide a route to design devices where a molecule may respond to various stimuli. A molecule may have multiple cores that may respond to radio frequency (RF) energy, light, heat, and magnetic field to enable multiple controlling factors to attain multiple quantum states. For example, for the three-core molecule shown in FIG. 13 the first core 1305 of the molecule may respond to light radiation, the second core 1310 may respond to electric field, and the third core 1315 may respond to thermal energy. Alternatively, each of the three cores of the molecules shown in FIG. 13 may respond to radiations of different wavelengths to serve as an energy detector.

This TBELMD approach may also provide a method to make multi-chemical sensor. One may functionalize the different cores of a molecule to specifically interact with a molecule of interest. For instance, the three cores of the molecule 1305, 1310, and 1315 shown in FIG. 13 may be functionalized to interact with three distinct chemicals and register the interaction in the form or charge and spin flow in the TBELMD. This TBELMD approach may also do simultaneous detection of multiple biological and defense specific chemicals. TBELMD may target chemicals such as chlorine, hydrogen sulfide, ammonia, hydrogen cyanide, sarin, phosphine, arsine, nitrogen dioxide, and carbon monoxide. On the other hand, TBELMD based biomolecular sensor may be designed to perform electrochemistry based sensing and field effect based sensing. For electrochemical sensing of biomolecules at least one of the two metal electrodes 1005 and 1025 of the TBELMD should employ gold or platinum like nobel metals. These metals may allow TBELMD to exchange electrons with a target molecule or molecule to be detected. Utilization of nobel metals can enable TBELMD to detect chemical such as dopamine, serotonin, ascorbic acid, and glucose etc. TBELMD invention can also utilizes field effect-based sensing to detect the molecules of interest. As a field effect sensor, molecule used in TBELMD may function like a field effect sensor. If a foreign biomolecule or a threat chemical comes close to TBELMD, then current passing through TBELMD's molecule may change. The change in the TBELMD's molecule current due to foreign molecule may help in the identification and quantification. For these application TBELMD molecules, which are bridged between two metal films, serve as a field effect sensor or molecular sensor.

In one embodiment, this invention discloses a method of placing molecular device elements or molecular sensor in the open area along the magnetic tunnel junction edges to facilitate the interaction with external molecules. In such case electron's spin will be instrumental in chemical sensing. A target chemical or biomolecule interact with the molecular device element or molecular sensor and hence influence the spin transport via the molecular sensor. The molecular device elements can be specifically designed to only interact with the intended chemical or biomolecules. TBELMD allow the use of spin transport via molecular sensor to detect DNA nucleotides. For this task ferromagnetic electrodes are functionalized with the molecular sensor that captures DNA nucleotides via hydrogen bonds. Then identities of the individual nucleotides are expressed by the change in spin current due to single-molecule bonding events. Prior reference that accomplishes such task by an alternative device fabricated through different route is discussed in the reference (P. Pang, B. A. Ashcroft, W. Song, P. Zhang, S. Biswas, Q. Qing, et al., "Fixed-gap tunnel junction for reading DNA nucleotides," *ACS-NANO*, vol. 8, pp. 11994-12003, 2014. However, prior work was unable to utilize molecular sensor whose length is smaller than the thickness of the insulating barrier between the first and second metal layers. Hence, prior work has been limited by the limited types of molecules and limited types of metallic leads that can be used for chemical sensing. The disclosed invention also highlight focuses on TBELMD capability to serve as biochemical sensor by utilizing spin property of electron.

In FIG. 13 a three core molecule is proposed to make bond with the three metal electrodes. The first 1305 and third core 1315 of the molecules may make direct contact with the ferromagnetic electrode to produce two ferromagnet-molecule interface regions. Each of these two interfaces may have different switching fields with respect to each other and also with regards to bulk regions of the two ferromagnets. With this TBELMD arrangement at least two device states may be realized to perform memory and logic device operations. In addition, gate electrode may be chemically bonded to the middle section of the molecule to electrostatically maneuver the molecular energy levels to produce a field effect based spin-interface device.

Figure 14:
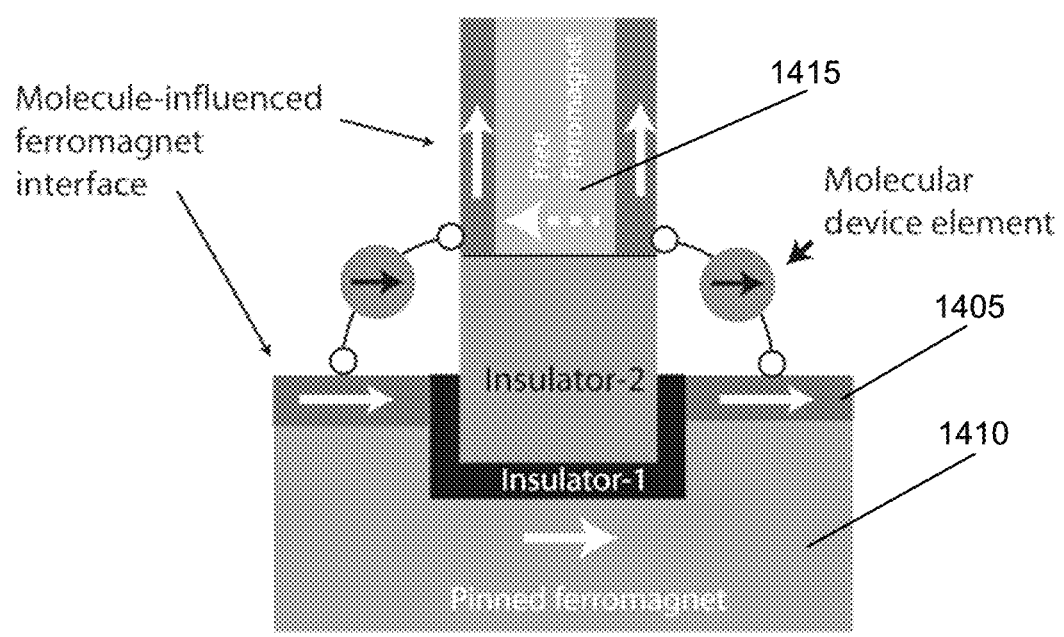
FIG. 14 illustrates a cross sectional view of an exemplary two terminal TBELMD based Spinterface device, in accordance with an embodiment of the invention.

The TBELMD approach may also provide a practical method of making spinterface devices as illustrated in FIG. 14. The properties of TBELMD based spinterface devices may be governed by the molecule-ferromagnet interfaces. Spinterface devices may focus on specific properties of the molecule-ferromagnetic electrode interfaces to obtain multiple device states for logic and memory operations. A complex molecule with multiple centers may produce spin-interface devices. Direct interaction between the specific section of a molecule and ferromagnetic metal may induce strong hybridization. Due to this strong hybridization interfacial regions 1405 may acquire different magnetic anisotropy and hardness as compared to the bulk body 1410 and 1415 of the ferromagnetic electrodes. As a result, the magnetic field required to switch the direction of magnetic moments in the molecule-ferromagnet interface regions may be much different than that required for the bulk ferromagnet. FIG. 14 illustrates a cross sectional view of an exemplary two terminal TBELMD based interface device, in accordance with an embodiment of the invention. This figure shows that at the interfaces where molecules chemically bond with the ferromagnetic electrodes new regions 1405 may appear. These new regions possess significantly different magnetic properties than that possessed by the bulk of the bottom 1410 and top ferromagnetic electrode 1415. As a result, the magnetic hysteresis behavior, the magnetic field at which a magnetic material switch direction, become different for the interface regions 1405 as compared to bulk ferromagnets (1415 and 1410 regions).

Figure 15:
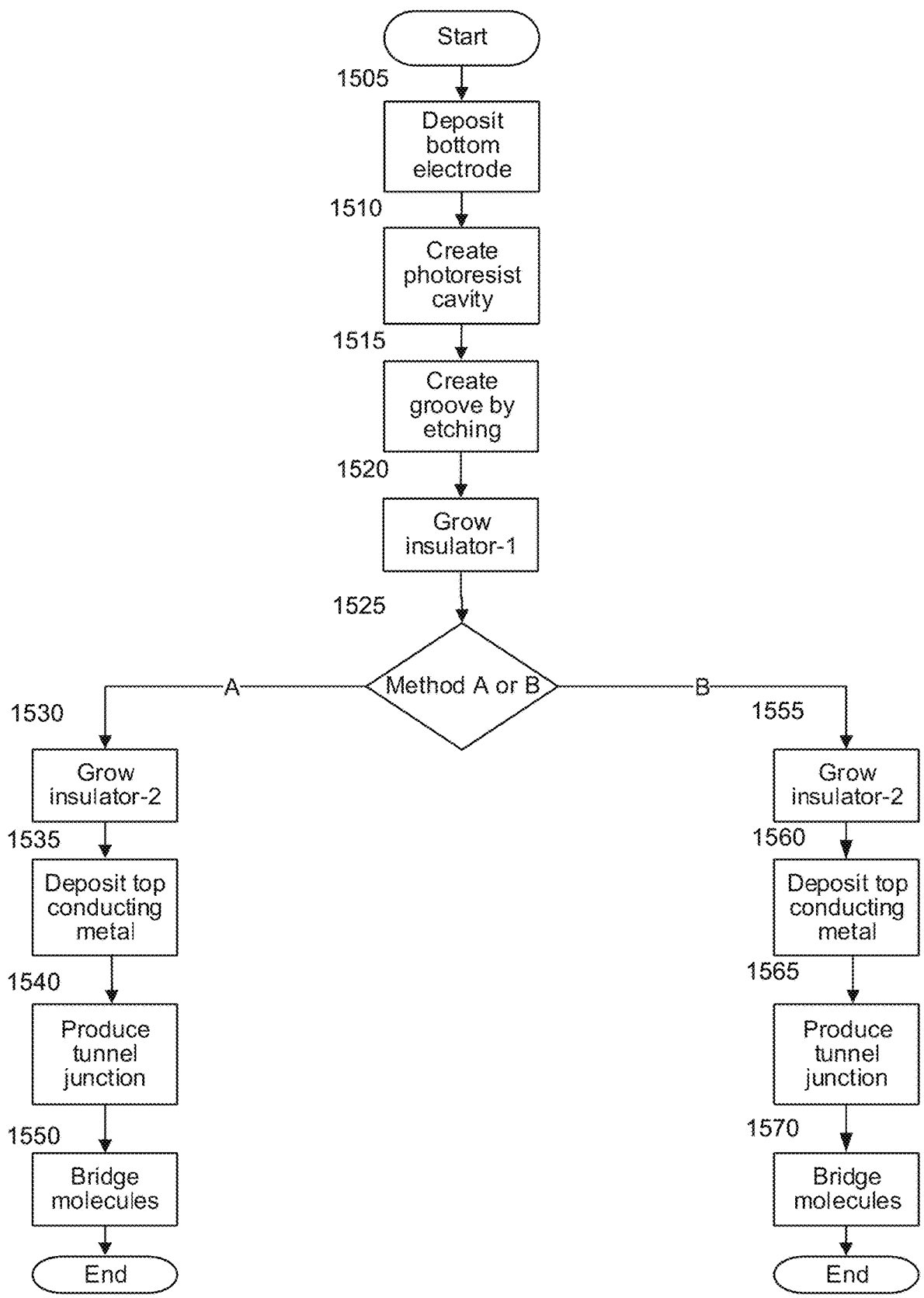
FIG. 15 illustrates a flowchart of a method for fabricating an exemplary trenched bottom metal electrode and liftoff based molecular device, in accordance with the invention.

FIG. 15 illustrates a flowchart of a method for fabricating an exemplary trenched bottom metal electrode and liftoff based molecular device TBELMD, in accordance with an embodiment of the invention. A trenched bottom electrode may enable four forms of tunnel junctions based molecular devices. Two approaches (method A and method B) are discussed in this figure; however, remaining two approaches (method C and method D) are discussed in FIG. 16 and FIG. 17. In reference to FIGS. 4, 5 and 6, FIG. 14 corresponds to the methods in FIG. 4, FIG. 15 corresponds to FIG. 5, and FIG. 16 corresponds to FIG. 6. In reference to this figure, in a step 1505 a bottom electrode is deposited on an insulating substrate. In a step 1510 photolithography may be used to create window in photoresist layer for creating a trench in the bottom electrode. In a step 1515 a desired thickness may be removed from bottom electrode, where an amount of material removed will be determined based on the type of molecular device elements. In a step 1520 the bottom electrode metal may be oxidized to create an insulator-1. In a step 1525 a choice may be made from two possible options of methods (A) or (B).

For small molecules option method A may be more useful. For method A, in a step 1530 an insulator-2 may be deposited in such a manner that insulator-2 thickness may be lesser than the trench depth. In a step 1535 a top conducting metal electrode may be deposited on the top of the insulator-2. In a step 1540 liftoff of photoresist may produce a tunnel junction with the exposed side edges. In a step 1550 molecules of interest may be bridged between two metal electrodes along the two exposed edges of the tunnel junctions.

For the large molecules the option method B may be more useful. For method B, step 1555 focuses on depositing the insulator-2 in such a manner that insulator-2 thickness may be more than the trench depth. In a step 1560 a top conducting metal electrode may be deposited on the top of insulator-2. In a step 1565 photoresist liftoff may be used to produce tunnel junction with the exposed side edges. In a step 1570 molecules of interest may be bridged between two metal electrodes along the two exposed edges of the tunnel junctions.

FIG. 16 illustrates a flow chart of a method for forming exemplary molecular device (referred to as method "C") for fabrication of a trenched bottom electrode based molecular devices for the cases when bottom electrode cannot be oxidized to produce insulator-1, in accordance with an embodiment of the invention. A method C may be useful for fabrication of a trenched bottom electrode based molecular devices for the cases when bottom electrode may not be oxidized to produce insulator-1. For example, a bottom electrode may be made up of gold and platinum like inert metals and semiconductor like gallium arsenide (GaAs). For this case: in a step 1605 a first metal strip may be deposited on an insulating substrate. In a step 1610 photolithography may be used to produce a window in the photoresist for creating a trench in the first strip or bottom electrode. In a step 1615 a desired thickness may be removed from the bottom electrode, an amount of material removed may be determined based on the type of molecular device elements. In a step 1620 an insulator may be deposited in such a manner that insulator thickness may be more than the trench depth. In a step 1625 a top conducting metal electrode may be deposited on the insulator. In a step 1630 liftoff photoresist may be used to produce a tunnel junction with the exposed side edges. In a step 1635 molecules of interest may be bridged between two metal electrodes along the two exposed edges of the tunnel junctions.

FIG. 17 illustrates a flow chart of a method for forming semiconductor structures (referred to as method "D") for fabrication of trenched bottom electrode based molecular devices for the cases when bottom electrode cannot be oxidized to produce insulator-1, in accordance with an embodiment of the invention. An insulator-1 however may be deposited by attaching very small molecules via molecular self-assembly. In a step 1705 a bottom electrode is deposited on an insulating substrate. In a step 1710 photolithography creates a window in photoresist for creating a trench in the bottom electrode. In a step 1715 a desired thickness of the bottom electrode is removed, an amount of material removed will be determined by the type of molecular device elements. In a step 1720 small molecules are self-assembled to create a first insulator. In a step 1725 an insulator-2 is deposited in such a manner that insulator thickness may be more than the trench depth. In a step 1730 a top conducting metal electrode is deposited on the insulator. In a step 1735 liftoff of photoresist produces a tunnel junction with the exposed side edges. In a step 1740 molecules of interest are bridged between two metal electrodes along the two exposed edges of the tunnel junctions.

Figure 18:
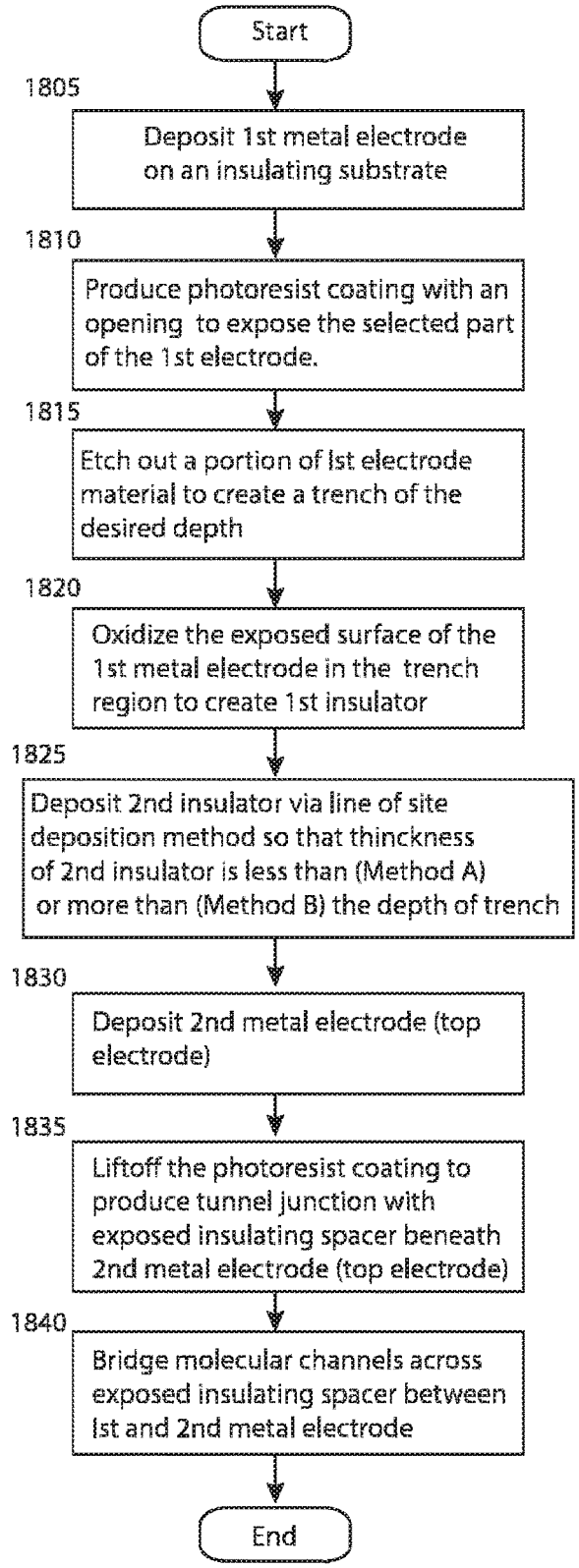
FIG. 18 illustrates a flow chart of a process where the 1st metal electrode will be oxidized to produce the 1st insulator, in accordance with an embodiment of the present invention.

FIG. 18 illustrates a flow chart of a process where the 1st metal electrode will be oxidized to produce the 1st insulator, in accordance with an embodiment of the present invention. Hence, the 1st metal electrode must be made up of a metal that produces an insulator after reacting with oxygen. Exemplary metals are Titanium, Tantalum, Nickel, etc. In a step 1805, a first conducting strip may be deposited with tapered edges. Tapered sides of the first electrode may ensure that any anomaly on edge does not damage the insulators. In a step 1810, photolithography may be conducted to create a window in the photoresist. The window in photoresist may be crucial for matching the lateral dimension of at least one insulator and at least one metal strip that may be deposited on the first metal strip for completing tunnel junction.

In a step 1815 a trench in the first metal strip may be formed by etching away material from the top of the first metal strip from unprotected region. Trench depth may be controlled to facilitate the bridging a desired molecule between the first and the second metal strips.

In a step 1820, the trench region, the first insulator (Insulator-1), may be created by the plasma oxidation of the first metal strip. For this objective metal, the first electrode should be made up of a metal that produces good quality surface oxide to serve as an insulator (insulator-1). Exemplary metals are Titanium, Tantalum, and Nickel. However, if the metal is unable to produce the good oxide, insulator-1 can be produced by adding a monolayer of insulating molecules by the self-assembly process in the trench region.

In a step 1825, a second insulator (insulator-2) may be deposited on the top of the insulator-1 surface. Insulator-2 may be alumina (AlOx), magnesium oxide (MgO), silicon dioxide, silicon nitride, etc. In a step 1830, a second metal strip was deposited on the top of at least one insulator. In a step 1835 photoresist layer and the materials sitting on the photoresist may be removed by the liftoff step. Liftoff may result in the tunnel junction testbed with the exposed side edges. In a step 1840, finally, a junction is submerged in the molecular solution to connect molecular bridges between the first and the second metal strips.

Those skilled in the art will readily recognize, in light of and in accordance with the teachings of the present invention, that any of the foregoing steps may be suitably replaced, reordered, removed and additional steps may be inserted depending upon the needs of the particular application. Moreover, the prescribed method steps of the foregoing embodiments may be implemented using any physical and/or hardware system that those skilled in the art will readily know is suitable in light of the foregoing teachings. For any method steps described in the present application that can be carried out on a computing machine, a typical computer system can, when appropriately configured or designed, serve as a computer system in which those aspects of the invention may be embodied.

All the features disclosed in this specification, including any accompanying abstract and drawings, may be replaced by alternative features serving the same, equivalent or similar purpose, unless expressly stated otherwise. Thus, unless expressly stated otherwise, each feature disclosed is one example only of a generic series of equivalent or similar features.

It is noted that according to USA law 35 USC § 112 (1), all claims must be supported by sufficient disclosure in the present patent specification, and any material known to those skilled in the art need not be explicitly disclosed. However, 35 USC § 112 (6) requires that structures corresponding to functional limitations interpreted under 35 USC § 112 (6) must be explicitly disclosed in the patent specification. Moreover, the USPTO's Examination policy of initially treating and searching prior art under the broadest interpretation of a "mean for" or "steps for" claim limitation implies that the broadest initial search on 35 USC § 112(6) (post AIA 112(f)) functional limitation would have to be conducted to support a legally valid Examination on that USPTO policy for broadest interpretation of "mean for" claims. Accordingly, the USPTO will have discovered a multiplicity of prior art documents including disclosure of specific structures and elements which are suitable to act as corresponding structures to satisfy all functional limitations in the below claims that are interpreted under 35 USC § 112(6) (post AIA 112(f)) when such corresponding structures are not explicitly disclosed in the foregoing patent specification. Therefore, for any invention element(s)/structure(s) corresponding to functional claim limitation(s), in the below claims interpreted under 35 § 112(6) (post AIA 112(f)), which is/are not explicitly disclosed in the foregoing patent specification, yet do exist in the patent and/or non-patent documents found during the course of USPTO searching, Applicant(s) incorporate all such functionally corresponding structures and related enabling material herein by reference for the purpose of providing explicit structures that implement the functional means claimed. Applicant(s) request(s) that fact finders during any claims construction proceedings and/or examination of patent allowability properly identify and incorporate only the portions of each of these documents discovered during the broadest interpretation search of 35 USC § 112(6) (post AIA 112(f)) limitation, which exist in at least one of the patent and/or non-patent documents found during the course of normal USPTO searching and or supplied to the USPTO during prosecution. Applicant(s) also incorporate by reference the bibliographic citation information to identify all such documents comprising functionally corresponding structures and related enabling material as listed in any PTO Form-892 or likewise any information disclosure statements (IDS) entered into the present patent application by the USPTO or Applicant(s) or any $3^{rd}$ parties. Applicant(s) also reserve its right to later amend the present application to explicitly include citations to such documents and/or explicitly include the functionally corresponding structures which were incorporate by reference above.

Thus, for any invention element(s)/structure(s) corresponding to functional claim limitation(s), in the below claims, that are interpreted under 35 USC § 112(6) (post AIA 112(f)), which is/are not explicitly disclosed in the foregoing patent specification, Applicant(s) have explicitly prescribed which documents and material to include the otherwise missing disclosure, and have prescribed exactly which portions of such patent and/or non-patent documents should be incorporated by such reference for the purpose of satisfying the disclosure requirements of 35 USC § 112 (6). Applicant(s) note that all the identified documents above which are incorporated by reference to satisfy 35 USC § 112 (6) necessarily have a filing and/or publication date prior to that of the instant application, and thus are valid prior documents to incorporated by reference in the instant application.

Having fully described at least one embodiment of the present invention, other equivalent or alternative methods of implementing fabrication of electronics according to the present invention will be apparent to those skilled in the art. Various aspects of the invention have been described above by way of illustration, and the specific embodiments disclosed are not intended to limit the invention to the particular forms disclosed. The particular implementation of the fabrication of electronics may vary depending upon the particular context or application. By way of example, and not limitation, the fabrication of electronics described in the foregoing were principally directed to computer logic and memory device implementations; however, similar techniques may instead be applied to chemical and energy sensing, which implementations of the present invention are contemplated as within the scope of the present invention. The invention is thus to cover all modifications, equivalents, and alternatives falling within the spirit and scope of the following claims. It is to be further understood that not all of the disclosed embodiments in the foregoing specification will necessarily satisfy or achieve each of the objects, advantages, or improvements described in the foregoing specification.

Claim elements and steps herein may have been numbered and/or lettered solely as an aid in readability and understanding. Any such numbering and lettering in itself is not intended to and should not be taken to indicate the ordering of elements and/or steps in the claims.

The corresponding structures, materials, acts, and equivalents of all means or step plus function elements in the claims below are intended to include any structure, material, or act for performing the function in combination with other claimed elements as specifically claimed.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

The Abstract is provided to comply with 37 C.F.R. Section 1.72(b) requiring an abstract that will allow the reader to ascertain the nature and gist of the technical disclosure. That is, the Abstract is provided merely to introduce certain concepts and not to identify any key or essential features of the claimed subject matter. It is submitted with the understanding that it will not be used to limit or interpret the scope or meaning of the claims.

The following claims are hereby incorporated into the detailed description, with each claim standing on its own as a separate embodiment.

What is claimed is:

1. A method comprising the steps of:
   depositing a first electrode material on an insulating substrate or layer;

performing a photolithography process in said first electrode material;

creating a trench component in said first electrode material with said photolithography process, the trench component being a section of said first electrode material with a depth based on at least one of, a molecular device element and a trenched bottom electrode and liftoff molecular device (TBELMD) to be produced; and oxidizing a portion of said first electrode material in the trench component and thus forming a first insulator part from said oxidized portion of said first electrode material.

2. The method of claim 1, in which said first electrode material comprises a conducting strip, in which said conducting strip comprises a film of multiple magnetic materials, wherein said film of multiple magnetic materials is operable for producing a controllable magnetic moment direction parallel to a first plane of said film of multiple magnetic materials.

3. The method of claim 1, further comprising the step of depositing a second insulator part in said trench component, wherein a thickness of said second insulator part is approximately less than a depth of said trench component and has a thickness, combined with the first insulator part, based on at least one of the molecular device and said TBELMD.

4. The method of claim 3, further comprising the step of depositing a second electrode material on top of said second insulator.

5. The method of claim 4, further comprising the step of producing a tunnel junction having at least one or more exposed side edges from the first electrode material, the first insulator part, the second insulator part, and the second electrode material.

6. The method of claim 5, further comprising the step of performing a liftoff of photoresist to produce said tunnel junction with said at least one or more exposed side edges.

7. The method of claim 6, further comprising the step of engaging said first electrode material and second electrode material with a molecular bridge at said at least one or more exposed side edges of said tunnel junction.

8. The method of claim 1, further comprising the step of depositing a second insulator part in said trench component, wherein a thickness of said second insulator part is approximately more than a depth of said trench component, and has a thickness, combined with the first insulator part, based on at least one of the molecular device and the TBELMD.

9. The method of claim 8, further comprising the step of depositing a second electrode material on top of said second insulator.

10. The method of claim 9, further comprising the steps of:

depositing a third insulator part on top of said second electrode material; and depositing a third electrode material on top of said third insulator part.

11. The method of claim 10, further comprising the step of producing a tunnel junction having at least one or more exposed side edges, from the first electrode material, the first insulator part, the second insulator part, and the second electrode material.

12. The method of claim 11, further comprising the step of engaging said first electrode material, said second electrode material, and said third electrode material with a molecular bridge, in which said bridge comprises at least a molecule core, at least three tethers, and at least three thiol anchoring compound.

13. The method of claim 7, in which said molecular bridge comprises at least a molecule core, at least two tethers, and at least two thiol anchoring compounds.

14. The method of claim 13, in which said the step of engaging said first electrode material and said second electrode material with said molecular bridge at said at least one or more exposed side edges of said tunnel junction comprises the step of engaging a first end portion of each of said at least two tethers to said molecule core.

15. The method of claim 14, in which said step of engaging said first electrode material and second electrode material with said molecular bridge at said at least one or more exposed side edges of said tunnel junction comprises the step of engaging said at least two thiol anchoring compounds to a second end portion of each of said at least two tethers.

16. The method of claim 15, in which said step of engaging said first electrode material and second electrode material with said molecular bridge at said at least one or more exposed side edges of said tunnel junction comprises the step of bonding a first of said at least two thiol anchoring compound to said first electrode material and bonding a second of said at least two thiol anchoring compound to said second electrode material.

17. A system comprising:

an insulating substrate or layer;

a first electrode material deposited on said insulating substrate or layer;

a trench component in said first electrode material created with a photolithography process, the trench component being a section in said first electrode material with a depth based on at least one of, a molecular device element and a trenched bottom electrode and liftoff molecular device (TBELMD) to be produced;

a first electrode metal disposed on a top portion of said first electrode material;

a first insulator part created from an oxidized portion of said first electrode metal;

a second insulator part deposited in said trench component, wherein a thickness of said second insulator part is more than a depth of said trench component and has a thickness, combined with the first insulator part, based on at least one of the molecular device implement and the TBELMD;

a second electrode material deposited on top of said second insulator;

the first electrode material, the first insulator part, the second insulator part, and the second electrode material forming a tunnel junction segment having at least one or more exposed side edge portions; and a molecular bridge implement, said molecular bridge implement is configured to engage said first electrode material to said second electrode material.

18. The system of claim 17, in which said molecular bridge implement comprises at least a molecule core, at least two tethers, and at least two thiol anchoring compounds.

19. The system of claim 17, further comprising:

a third insulator on the second electrode material;

a third electrode material on the third insulator;

wherein said molecular bridge implement is further configured to engage said third electrode material; and in which said molecular bridge implement comprises at least a molecule core, at least three tethers, and at least three thiol anchoring compounds.

20. A method comprising the steps of:

depositing a first electrode material on an insulating substrate or layer, in which said first electrode material comprises a conducting strip, and in which said conducting strip comprises a film of multiple magnetic materials;
performing a photolithography process in said first electrode material;
creating a trench component in said first electrode material with said photolithography process, the trench component being a section of said first electrode material with a depth based on at least one of, a molecular device element and a trenched bottom and liftoff molecular device (TBELMD) to be produced;
oxidizing a portion of said first electrode material and thus forming a first insulator part from said oxidized portion of said first electrode material;
depositing a second insulator part in said trench component;
depositing a second electrode material on top of said second insulator part;
forming a tunnel junction element having at least one or more exposed side edges from the first electrode material, the first insulator part, the second insulator part, and the second electrode material; and
engaging said first electrode material and second electrode material with a bridge implement at said at least one or more exposed side edges of said tunnel junction element, in which said bridge implement comprises at least a molecule core, at least two tethers, and at least two thiol anchoring compounds.

* * * * *